(12) United States Patent
Zaidi

(10) Patent No.: US 7,109,517 B2
(45) Date of Patent: Sep. 19, 2006

(54) METHOD OF MAKING AN ENHANCED OPTICAL ABSORPTION AND RADIATION TOLERANCE IN THIN-FILM SOLAR CELLS AND PHOTODETECTORS

(76) Inventor: Saleem H. Zaidi, 9813 Fostoria Rd., NE., Albuquerque, NM (US) 87107

( * ) Notice: Subject to any disclaimer, the term of this patent is extended or adjusted under 35 U.S.C. 154(b) by 197 days.

(21) Appl. No.: 10/298,694

(22) Filed: Nov. 15, 2002

(65) Prior Publication Data

US 2004/0021062 A1 Feb. 5, 2004

Related U.S. Application Data

(60) Provisional application No. 60/332,777, filed on Nov. 16, 2001.

(51) Int. Cl.
H01L 29/06 (2006.01)

(52) U.S. Cl. .......................... 257/22; 257/24
(58) Field of Classification Search ................ 438/22, 438/24; 257/79–83, 222–234
See application file for complete search history.

(56) References Cited

U.S. PATENT DOCUMENTS

| 3,969,746 | A | * | 7/1976 | Kendall et al. | |
|---|---|---|---|---|---|
| 4,516,314 | A | * | 5/1985 | Sater | |
| 5,067,985 | A | * | 11/1991 | Carver et al. | 136/255 |
| 5,268,039 | A | * | 12/1993 | Vogeli et al. | 136/256 |
| 6,132,585 | A | * | 10/2000 | Midorikawa et al. | |

OTHER PUBLICATIONS

Iles, P.A., "Future Use of Silicon Solar Cells in Extraterrestrial Applications," *Progress in Photovoltaics: Research and Applications*, vol. 2, John Wiley & Sons, Ltd., 1994, pp. 95–106.

Sharps, P.R., Timmons, M.L., Venkatasubramanian, R., Pickett, R., Hills, J.S., Hancock, J., Hutchby, J., Iles, P., Chu, C.L., Wanlass, M., Ward, J.S., "Development of 20% Efficient GaInAsP Solar Cells," *IEEE PVSC 23*, 1993, pp. 633–638.

Iles, P.A., "Future of Photovoltaics for Space Applications," *Progress in Photovoltaics: Research and Applications*, vol. 8, John Wiley & Sons, Ltd., 2000, pp. 39–51.

Tringe, J., Merrill, J., Reinhardt, K., "Developments in Thin–Film Photovoltaics for Space," *IEEE PVSC 28*, pp. 1242–1245.

Yamaguchi, M., Taylor, S.J., "Mechanism for the Anomalous Degradation of Si Solar Cells Induced by High Influence 1 MeV Electron Irradiation," *Appl. Phys. Lett.*, vol. 68.22, American Institute of Physics, May 27, 1996, pp. 3141–3143.

(Continued)

*Primary Examiner*—Fetsum Abraham
(74) *Attorney, Agent, or Firm*—Samuel M. Freund; Cochran Freund & Young LLP

(57) ABSTRACT

Subwavelength random and periodic microscopic structures are used to enhance light absorption and tolerance for ionizing radiation damage of thin film and photodetectors. Diffractive front surface microscopic structures scatter light into oblique propagating higher diffraction orders that are effectively trapped within the volume of the photovoltaic material. For subwavelength periodic microscopic structures etched through the majority of the material, enhanced absorption is due to waveguide effect perpendicular to the surface thereof. Enhanced radiation tolerance of the structures of the present invention is due to closely spaced, vertical sidewall junctions that capture a majority of deeply generated electron-hole pairs before they are lost to recombination. The separation of these vertical sidewall junctions is much smaller than the minority carrier diffusion lengths even after radiation-induced degradation. The effective light trapping of the structures of the invention compensates for the significant removal of photovoltaic material and substantially reduces the weight thereof for space applications.

36 Claims, 26 Drawing Sheets

OTHER PUBLICATIONS

Prat, L., Alcubilla, R., Blasco, E., Garcia, E., Calderer, J., Correig, X., "Spectral Response Degradation of Bifacial Silicon Solar Cells," *Solar Cells*, vol. 31, Elsevier Sequoia, Netherlands, 1991, pp. 47–56.

Suzuki, A., Kaneiwa, M., Saga, T., Matsuda, S., "Progress and Future View of Silicon Space Solar Cells in Japan," *IEEE Transactions on Electron Devices*, vol. 46.10, IEEE, Oct. 1999, pp. 2126–2132.

Hovel, H.J., *Semiconductors and Semimetals: Solar Cells*, vol. 11, Academic Press, New York, 1975.

Green, M.A., Keevers, M.J., "Short Communication: Optical Properties of Intrinsic Silicon at 300 K," *Progress in Photovoltaics: Research and Applications*, vol. 3, John Wiley & Sons, Ltd, 1995, pp. 189–192.

Campbell, P., Green, M.A., "Light Trapping Properties of Pyramidally Textured Surfaces," *J. Appl. Phys.*, vol. 62.1, American Institute of Physics, Jul. 1, 1987, pp. 243–249.

Zaidi, S.H., Ruby, D.S., Gee, J.M., "Characterization of Random Reactive Ion Etched–Textured Silicon Solar Cells," *IEEE Transactions on Electron Devices*, vol. 48.6, IEEE, Jun. 2001, pp. 1200–1206.

Gaylord, T.K., Baird, W.E., Moharam, M.G., "Zero–Reflectivity High Spatial–Frequency Rectangular–Groove Dielectric Surface–Relief Gratings," *Applied Optics*, vol. 25.24, Optical Society of America, Dec. 15, 1986, pp. 4562–4567.

Raguin, D.H., Morris, G.M., "Antireflection Structured Surfaces for the Infrared Spectral Region," *Applied Optics*, vol. 32.7, Mar. 1, 1993, pp. 1154–1167.

Sheng, P., Bloch, A.N., Stepleman, R.S., "Wavelength–Selective Absorption Enhancement in Thin–Film Solar Cells," *Appl. Phys. Lett.*, vol. 43.6, American Institute of Physics, Sep. 15, 1983, pp. 579–581.

Heine, C., Morf, R.H., "Submicrometer Gratings for Solar Energy Applications," *Applied Optics*, vol. 34.14, May 10, 1995, pp. 2476–2482.

Zaidi, S.H., Chu, A.–S., Brueck, S.R.J., "Optical Properties of Nanoscale, One–Dimensional Silicon Grating Structures," *J. Appl. Phys.*, vol. 80.12, American Institute of Physics, Dec. 15, 1996, pp. 6997–7008.

Zaidi, S.H., Gee, J.M., Ruby, D.S., "Diffraction Grating Structures in Solar Cells," *IEEE PVSC*, 2000, pp. 395–398.

Wohigemuth, J., Scheinine, A., "New Developments in Vertical Junction Silicon Solar Cells," IEEE Photovoltaic Specialists Conference, 1980, 151–155.

Presting, H., Konle, J., Behammer, D., Gruhle, A., Uebele, P., Strobl, G., "Fabrication of Si Trench Solar Cells with Improved Radiation Hardness for Space Applications," $28^{th}$ IEEE PVSC, session 4P2.LN1, 2000.

Yablonovitch, E., "Statistical Ray Optics," *J. Opt. Soc. Am.*, vol. 72.7, Optical Society of America, Jul. 1982, pp. 899–907.

Deckman, H.W., Wronski, C.R., Witzke, H., Yablonovitch, E., "Optically Enhanced Amorphous Silicon Solar Cells," *Appl. Phys. Lett.*, vol. 42.11, American Institute of Physics, Jun. 1, 1983, pp. 968–670.

Fahrenbruch, A.L., Bube, R.H., *Fundamentals of Solar Cells: Photovoltaic Solar Energy Conversion*, Academic Press, New York, 1983.

Malag, A., "Simple Interference Method of Diffraction Grating Generation for Integrated Optics by the Use of a Fresnel Mirror," *Optics Communications*, vol. 32.1, Jan. 1980, pp. 54–58.

Zaidi, S.H., Brueck, S.R.J., "High Aspect–Ratio Holographic Photoresist Gratings," *Applied Optics*, vol. 27.14, Optical Society of America, Jul. 15, 1988, pp. 2999–3002.

Kopalidis, P.M., Jorne, J., "Langmuir Probe Measurements and Characterization of Silicon Etching in $SF_6/O_2$ Discharges," *J. Electrochem. Soc.*, vol. 139.3, The Electrochemical Society, Inc., Mar. 1992, pp. 839–844.

Bean, K.E., "Anisotropic Etching of Silicon," *IEEE Transactions on Electron Devices*, vol. ED–25.10, IEEE, Oct. 1978, pp. 1185–1192.

Turner, D.R., "Electropolishing Silicon in Hydrofluoric Acid Solutions," *Journal of the Electrochemical Society*, vol. 105, Jul. 1958, pp. 402–408.

Ottow, S., Lehmann, V., Foll, H., "Processing of Three–Dimensional Microstructures Using Macroporous n–type Silicon," *J. Electrochem. Soc.*, vol. 143.1, The Electrochemical Society, Inc., Jan. 1996, pp. 385–390.

Ohji, H., French, P.J., Tsutsumi, K., "Fabrication of Mechanical Structures in p–type Silicon Using Electrochemical Etching," *Sensors and Actuators*, vol. 82, Elsevier Science S.A., 2000, 254–258.

Wehrspohn, R.B., Chazalviel, J.–N., Ozanam, F., "Macropore Formation in Highly Resistive p–type Crystalline Silicon," *J. Electrochem Soc.*, vol. 145.8, The Electrochemical Society, Inc., Aug. 1988, pp. 2958–2961.

Zaidi, S.H., Marquadt, R., Minhas, B., Tringe, J.W., "Deeply Etched Gratings Structures for Enhanced Absorption in Thin C–Si Solar Cells," *IEEE PVSC 29*, 2002, pp. 1290–1293.

Pang, S.W., Rathman, D.D., Silversmith, D.J., Mountain, R.W., DeGraff, P.D., "Damage Induced in Si by Ion Milling or Reactive Ion Etching," *J. Appl. Phys.*, vol. 54.6, American Institute of Physics, Jun. 1983, pp. 3272–3277.

Ruby, D.S., Zaidi, S.H., Narayanan, S., "Plasma–Texturization for Multicrystalline Silicon Solar Cells," $28^{th}$ *IEEE PVSC*, 2000, pp. 75–78.

Ibbotson, D.E., Mucha, J.A., Flamm, D.L., Cook, J.M., "Plasmaless Dry Etching of Silicon with Fluorine–Containing Compounds," *J. Appl. Phys.*, vol. 56.10, Nov. 15, 1984, pp. 2939–2942.

Douglas, E.C., D'Aiello, R.V., "A Study of the Factors Which Control the Efficiency of Ion–Implanted Silicon Solar Cells," *IEEE Transactions on Electron Devices*, vol. ED–27.4, IEEE, Apr. 1980, pp. 792–801.

Williams, J.S., Poate, J.M., editors, *Ion Implantation and Beam Processing*, Academic Press, New York, 1984.

Goeckner, M.J., Felch, S.B., Fang, Z., Lenoble, D., Galvier, J., Grouillet, A., Yeap, G.C.–F., Bang, D., Lin, M.–R. "Plasma Doping for Shallow Junctions," *J. Vac. Sci. Technol. B*, vol. 17.5, American Vacuum Society, Sep./Oct. 1999, pp. 2290–2293.

\* cited by examiner (b)

(a)

METHOD OF MAKING AN ENHANCED OPTICAL ABSORPTION AND RADIATION TOLERANCE IN THIN-FILM SOLAR CELLS AND PHOTODETECTORS

RELATED CASES

The present patent application claims the benefit of Provisional Patent Application Ser. No. 60/332,777 filed on Nov. 16, 2001 for "Method Of Deeply Etched Subwavelength Structures For Enhanced Optical Absorption In Solar Cells And Photodetectors."

STATEMENT REGARDING FEDERAL RIGHTS

This invention was made in part with government support under Contract No. F29601-00-C-0158 between the U.S. Missile Defense Agency and Gratings Incorporated, a New Mexico corporation. The government has certain rights in the invention.

FIELD OF THE INVENTION

The present invention relates generally to solar cells and photodetectors and, more particularly, to enhancement of absorption and tolerance to ionizing radiation, resulting from surface random and periodic microstructures formed from the material of the solar cell or photodetector for thin film (<50 μm) solar cells and photodetectors.

BACKGROUND OF THE INVENTION

Since its inception more than fifty years ago, silicon (Si) photovoltaic (PV) technology has been a reliable source of power for military and commercial satellites in space (See, e.g., P. Iles in *Progress in Photovoltaics: Research and Applications*, Vol. 2, 95 (1994)). However, more recently, the III–V compound semiconductor technology has developed with the availability of high-throughput thin film deposition systems on germanium substrates and subsequent fabrication of high-efficiency (~25%), multi-junction solar cells (See, e.g., P. R. Sharps, et al., IEEE PVSC 23, 650 (1993)).

Silicon (Si) solar cells for use in space environments have not experienced comparable improvements and, as a result, have lost a significant market share to the compound semiconductor multi-junction solar cell technology. However, radiation-tolerant Si solar cells with efficiencies (~20–25%) remain a viable option for several space applications including nanosatellites, unmanned space vehicles, and commercial satellites not requiring high efficiencies (See, e.g., P. Iles in Progress in Photovoltaics: Research and Applications, Vol. 8, 2864 (2000)). Additionally, thin-film Si solar cells also offer significant cost savings in manufacturing and launch expenses (See, e.g., J. Tringe et al., IEEE PVSC 28, 1242 (2000)). The performance of Si solar cells in space environments is severely degraded due to radiation of high-energy particles and electromagnetic radiation (See, e.g., M. Y. Yamaguchi, et al., Appl. Phys. Lett. 68, 3141 (1996)). The radiation-induced surface and volume damage creates volume recombination centers and reduces minority carrier diffusion lengths, resulting in a significant reduction of the cell performance in the near infrared (IR) region (See, e.g., L. Prat et al., Solar Cells 31, 47 (1991)). Improvements in Si space solar cells have been achieved by incorporation of back surface fields, surface texturing, fine grid spacing, and thinner substrates (See e.g., A. Suzuki et al., IEEE Trans. Elect. Dev. 46, 2126 (1999)). It has been well established that tolerance to ionizing radiation-induced recombination losses of Si solar cells is significantly improved by reducing cell thickness (See, e.g., S. Matsuda, et al., ESA, SP 320, 609 (1991)). Decreasing Si thickness also lowers weight.

Ideally, the cell optimum thickness is a fraction of the minority carrier diffusion length (See, e.g., H. J. Hovel, *Solar Cells, Semiconductors and Semimetals*, Vol. II. Academic press (1975)). However, in the near IR (~0.9–1.11-μm) wavelength range, optical absorption in Si is weak (See, e.g., M. A. Green and M. J. Keevers, *Progress in Photovoltaics: Research and Applications*, Vol. 3, 189 (1995)). Random, wet-chemical texturing techniques have been used to form pyramids in the (100) Si crystal orientation for reducing reflection and enhancing optical absorption by increased oblique coupling into the solar cells (See, e.g., P. Campbell and M. A. Green, Appl. Phys. Lett. 62, 243 (1987)). Applicability of these texturing schemes to thin wafer and films (~20–50 μm) is limited due to their large dimensions and preferential (100) crystal etching mechanisms.

Alternate approaches based on subwavelength random, or periodic microscopic structures aimed at reflection reduction and enhanced near-IR absorption have been extensively investigated. Randomly textured subwavelength surfaces reduce broadband reflection to <5% and enhance near-IR absorption through increased oblique coupling of light into the semiconductor (See, e.g., Saleem H. Zaidi et al., IEEE Trans. Elect. Dev. 48, 1200 (2001)). Random subwavelength surfaces represent a Fourier summation of a wide range of periodic microscopic structures, the enhanced near-IR absorption from such surfaces results from diffractive coupling of light as opposed to refractive oblique coupling in geometrically textured surfaces.

In contrast with random subwavelength microscopic structures, periodic subwavelength microscopic structures offer highly controllable mechanisms aimed at Si reflection and absorption response over a wide spectral range. T. K. Gaylord et al. in Appl. Opt. 25, 4562 (1986) have described rigorous models of rectangular profiled grating microscopic structures exhibiting zero reflection for a suitable choice of grating parameters. D. H. Raguin and G. M. Morris in Appl. Opt. 32, 1154 (1993) have determined broadband antireflection properties of 1D triangular and 2D pyramidal surfaces. Ping Shen et al. in Appl. Phys. Lett. 43, 579 (1983) have reported wavelength-selective absorption enhancement of thin-film (~2 μm) amorphous Si solar cells by grating coupling into waveguide modes. C. Heine and R. H. Morf in Appl. Opt. 34, 2478 (1983) have demonstrated enhanced near IR absorption in ~20-μm thick Si films by diffractive coupling. Broadband and narrowband spectral reflection response of subwavelength Si grating microscopic structures has been reported by Saleem H. Zaidi et al. in J. Appl. Phys. 80. 6997 (1996). Enhanced near IR response of subwavelength grating solar cells has also recently been demonstrated by Saleem H. Zaidi et al., in IEEE PVSC 28, 395 (2000).

Gaylord et al., supra, describes the anti-reflection properties of 1D rectangular grating microscopic structures; however, the need to create absorption close to the solar cell junction particularly in near IR spectral range is not discussed. Heine and Morf, supra, describe a diffractive approach directed at improving solar cell response at λ~1.0 μm. For thin-film solar cells, near IR absorption is weak due to the indirect bandgap of Si. By fabricating a grating structure at the back surface of the cell, enhanced absorption can be achieved by efficient coupling of the incident beam into two diffraction orders for a symmetric profile, or a single diffraction order for a blazed profile. Heine and Morf teach away from the use of a front surface grating because of surface passivation issues. By proper design of grating parameters, Heine and Morf have chosen the direction of propagation of diffraction orders such that at angles larger than the critical angle, these orders are trapped as a result of total internal reflection.

The concept of improving electron-hole pair (EHP) collection in the volume of a solar cell using deeply etched trenches was investigated in (110) Si solar cells for the purpose of improving radiation tolerance (See, e.g., John Wohlgemuth and A. Scheinine, IEEE Photovoltaic Specialists Conference, page 151 (1980)). Because of the preferential etch differential between <111> and <110> planes, simple wet-chemical etching chemistry can be employed to form one-dimensional trenches in (110) Si (See, e.g., Saleem H. Zaidi et al., J. Appl. Phys. 80, 6997 (1996). In IEEE PVSC 28, 1293 (2000) trenches formed in (100) Si using deep reactive ion etching techniques were investigated by H. Presting et al. The structures employed were macroscopic (>> optical wavelengths) and the observed improvements were marginal, presumably, the result of a lack of enhanced near-IR absorption. In both (110) Si vertical grooves, and (100) Si deep random ion etching (DRIE) trenches, a significant fraction of the EHPs generated in the volume of the cell is lost to recombination due to the inability of the material to absorb near IR radiation near the junction areas.

Accordingly, it is an object of the present invention to improve light absorption in thin films (<50 μm) used as solar cells and photodetectors in the near-IR spectral range.

Another object of the present invention is to enhance volume collection of electron/hole pairs in solar cells and photodetectors used in the presence of ionizing radiation.

Additional objects, advantages and novel features of the invention will be set forth, in part, in the description that follows, and, in part, will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects of the present invention, and in accordance with its purposes, as embodied and broadly described herein, the method for forming thin film solar cells and photodetectors having increased light absorption and radiation tolerance hereof includes: forming a plurality of macroscopic features having a chosen periodic spacing, width and depth on a first surface of a doped film suitable for solar cell or photodetector applications and formed therefrom, each feature having at least one surface perpendicular to the first surface of the film and one surface parallel thereto, there also being formed surfaces between each of the plurality of macroscopic features; attaching an electrical contact to at least a portion of a second surface of the film, the second surface being generally parallel to and spaced apart a chosen thickness from the first surface; doping the region of the surfaces of the plurality of macroscopic features and the region of the surfaces between each of the plurality of macroscopic features, forming thereby a p-n junction with the doped film; attaching an electrical contact to at least a portion of the junction, whereby the film is adapted to produce a photovoltaic response to light having a chosen wavelength or wavelengths incident thereon, the period of the macroscopic features, the width and the depth thereof and the thickness between the first and second surfaces of the film being chosen such that minority carrier diffusion length for carriers produced by the photovoltaic response of the film is larger than the largest distance between a location interior to the film and the junction; and randomly etching 3-dimensional microscopic structures having dimensions less than the wavelength or wavelengths of light onto the surfaces of the macroscopic features which are parallel to the surface of the film, onto the surfaces between each of the plurality of macroscopic features and onto the surfaces of each macroscopic feature perpendicular to the first surface of the film, such that light incident thereon is scattered into a multiplicity of high diffraction orders which propagate obliquely to the direction of incidence of the light, thereby trapping the incident light by total internal reflection and increasing light absorption by the film.

In another aspect of the present invention, in accordance with its objects and purposes, the method for forming solar cells and photodetectors having increased light absorption and radiation tolerance hereof includes: forming a plurality of macroscopic features having a chosen periodic spacing, a chosen width and a chosen depth on a first surface of a doped film suitable for solar cell and photodetector applications and formed therefrom, each feature having at least one surface perpendicular to the first surface of the film and one surface parallel thereto, there also being formed surfaces between each of the plurality of macroscopic features; attaching an electrical contact to at least a portion of a second surface of the film, the second surface being generally parallel to and spaced apart a chosen thickness from the first surface; doping the region of the surfaces of the plurality of macroscopic features and the region of the surfaces between each of the plurality of macroscopic features, thereby forming a p-n junction with the doped film; attaching an electrical contact to at least a portion of the doped surfaces, whereby the film is adapted to produce a photovoltaic response to light having a chosen wavelength or wavelengths incident thereon, the period of the macroscopic features, the width and the depth thereof, and the thickness between the first and second surfaces of the wafer being chosen such that minority carrier diffusion length for carriers produced by the photovoltaic response of the film is larger than the largest distance between a location interior to the film and the junction; and generating a microscopic grating structure having a second chosen period on the surface of each macroscopic feature parallel to the first surface of the film and on the surfaces of each macroscopic feature perpendicular to the first surface of the film, wherein the second chosen period is smaller than the chosen period of the macroscopic features, whereby incident light thereon is distributed into higher diffraction orders which are trapped within the macroscopic features.

In yet another aspect of the invention, in accordance with its objects and purposes, the method for forming solar cells and photodetectors having increased light absorption and radiation tolerance hereof includes: forming a microscopic grating structure having a chosen period and chosen depth on a first surface of a doped film suitable for solar cell and photodetector applications; attaching an electrical contact on at least a portion of a second surface of the film, the second surface being generally parallel to and spaced apart a chosen thickness from the first surface, wherein the chosen depth of the grating structure is comparable to the chosen thickness of the film; doping the surfaces of the generated microscopic grating structure, forming thereby a p-n junction with the film; and attaching an electrical contact to at least a portion of the doped surfaces of the generated microscopic grating structure, whereby the film is adapted to produce a photovoltaic response to light having a chosen wavelength or wavelengths incident thereon, the chosen period of the microscopic grating structure and the thickness between the first and second surfaces of the film being chosen such that minority carrier diffusion length for carriers produced by the photovoltaic response of the film is larger than the largest distance between a location interior to the film and the junction.

In still another aspect of the present invention in accordance with its objects and purposes, the photovoltaic device having increased light absorption and radiation tolerance hereof includes, which comprises in combination: a doped film suitable for photovoltaic applications; a plurality of macroscopic features having a chosen periodic spacing, a chosen width and a chosen depth formed on a first surface of the film from the film, each feature having at least one surface perpendicular to the first surface of the film and one surface parallel thereto, there also being formed surfaces between each of the plurality of macroscopic features, and the region of the surfaces of the plurality of macroscopic features and the region of the surfaces between each of the plurality of macroscopic features being doped, forming thereby a p-n junction with the film; an electrical contact attached to at least a portion of a second surface of the film, the second surface being generally parallel to and spaced apart a chosen thickness from the first surface thereof; an electrical contact attached to at least a portion of the junction, whereby the film is adapted to produce a photovoltaic response to light having a chosen wavelength or wavelengths incident thereon, the period of the macroscopic features, the width and the depth thereof, and the thickness between the first and second surfaces of the film being chosen such that minority carrier diffusion length for carriers produced by the photovoltaic response of the film is larger than the largest distance between the junction and a location within the film; and a randomly etched 3-dimensional microscopic structure having dimensions less than the wavelength or wavelengths of light disposed on the surfaces of the macroscopic features which are parallel and perpendicular to the surface of the film and on the surfaces between each of the plurality of macroscopic features such that light incident thereon is scattered into a multiplicity of high diffraction orders which propagate obliquely to the direction of incidence of the light, thereby trapping the incident light by total internal reflection and increasing light absorption by the film.

In a further aspect of the invention, in accordance with its objects and purposes, the photovoltaic device having increased light absorption and radiation tolerance hereof, includes: a doped film suitable for photovoltaic applications; a plurality of silicon macroscopic features having a chosen periodic spacing, a chosen width and a chosen depth formed on a first surface of the film, each feature having at least one surface perpendicular to the first surface of the film and one surface parallel thereto, there also being formed surfaces between each of the plurality of macroscopic features; an electrical contact attached to at least a portion of a second surface of film, the second surface being generally parallel to and spaced apart a chosen thickness from the first surface, and the region of the surfaces of the plurality of macroscopic features and the region of the surfaces between each of the plurality of macroscopic features being doped, forming thereby a p-n junction with the film; an electrical contact attached to at least a portion of the junction, whereby the film is adapted to produce a photovoltaic response to light having a chosen wavelength or wavelengths incident thereon, the period of the macroscopic features, the width and the depth thereof and the thickness between the first and second surfaces of the film being chosen such that minority carrier diffusion length for carriers produced by the photovoltaic response of the film is larger than the largest distance between a location interior to the film and the junction; and a microscopic grating structure having a second chosen period formed on the surfaces of each of the macroscopic features parallel and perpendicular to the first surface of the film wherein the second chosen period is smaller than the chosen period of the macroscopic features, whereby incident light thereon is distributed into higher diffraction orders which are trapped within the macroscopic features.

In another aspect of the invention, in accordance with its objects and purposes, the photovoltaic device having increased light absorption and radiation tolerance hereof, includes: a doped film suitable for photovoltaic applications; a microscopic grating structure having a chosen period, a chosen width and chosen depth formed on a first surface the film, the surfaces of the grating structure being doped, forming thereby a p-n junction with the film; an electrical contact attached to at least a portion of a second surface of the film, the second surface being generally parallel to and spaced apart a chosen thickness from the first surface, wherein the chosen depth of the microscopic grating structure is approximately equal to the chosen thickness of the film; and an electrical contact attached to at least a portion of the doped surfaces of the grating structure, whereby the film is adapted to produce a photovoltaic response to light having a chosen wavelength or wavelengths incident thereon, the chosen period of the grating structure and the thickness between the first and second surfaces of the film being chosen such that minority carrier diffusion length for carriers produced by the photovoltaic response of the film is larger than the largest distance between a location interior to the film and the junction.

Benefits and advantages of the present method include photovoltaic devices having enhanced optical absorption and enhanced tolerance to ionizing radiation for solar cell, space solar cell, and wavelength-selective photodetector applications, where enhanced IR response is required as a result of either insufficient film thickness for absorption or radiation-induced volume damage leading to low-lifetime material.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings:

FIG. 6a is planar reference film, FIG. 6b is a grating structure etched the majority of the way through the thin film, and FIG. 6c is a grating structure partially etched through the thin film.

FIG. 8a is a graph of optical absorption as a function of wavelength for several thicknesses and depths of a one-dimensional (1D) silicon grating with an underlying silicon thin film on an aluminum substrate, while FIG. 8b is a graph of the averaged optical absorption as a function of film thickness for the 3, thin-film configurations shown in FIGS. 6a–6c hereof.

FIG. 9a is a graph of the optical absorption as a function of wavelength for two-dimensional (2D) silicon gratings having several thicknesses on an underlying silicon film on an aluminum substrate, while FIG. 9b is a graph of the averaged optical absorption for the three, 2D thin-film grating thickness/thin film thickness combinations.

FIG. 17a having features with ~0.05 μm width, ~0.1 μm spacing, and ~8 μm depth; and FIG. 17b having features with ~0.35-μm diameter and a depth of ~13 μm.

DETAILED DESCRIPTION

Figure 1:
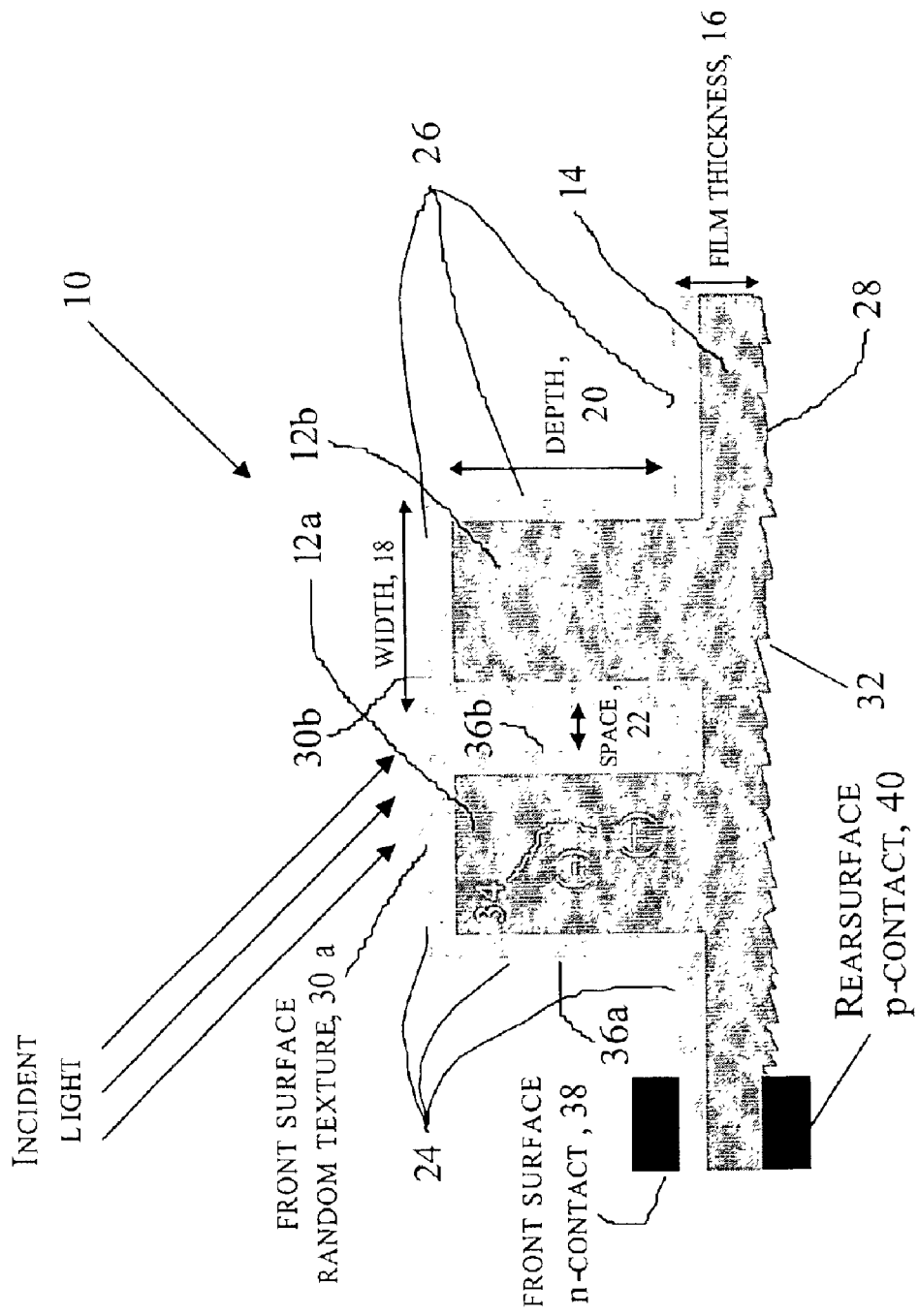
FIG. 1 is a schematic representation of one embodiment of the radiation-tolerant, thin-film silicon photovoltaic device of the present invention, showing subwavelength random microscopic structures etched onto the active light absorbing regions of the front and back surfaces of the thin film.

Briefly, the present invention includes the use of subwavelength random and periodic microscopic structures for enhancing light absorption and immunity to ionizing radiation damage of thin-film solar cells and photodetectors, hereinafter being referred to as photovoltaic devices. Front surface random and periodic microscopic structures can be classified either as diffractive or waveguide elements. Diffractive front surface microscopic structures scatter light into oblique propagating higher diffraction orders that are effectively trapped within periodic surface features etched through the majority of the thin film. The microscopic periodic surface features further enhance absorption by acting as light waveguides perpendicular to the solar cell surface. Typically, the photovoltaic devices of the present invention have dimensions as follows: thin film thickness is between 15 μm and 50 μm, and the plurality of surface features each have a chosen width between 1 μm and 50 μm, a depth of between 10 μm and 30 μm, and a spacing of between 0.5 μm and 5 μm.

The enhanced radiation tolerance of these structures is due to closely spaced, vertical sidewall p-n or n-p junctions that capture a majority of deeply generated electron-hole pairs before they are lost to recombination. The separation of these vertical sidewall junctions is smaller than the minority carrier diffusion lengths even after radiation-induced degradation. The various optical structures and configurations described here can be easily fabricated by employing well-known laser-interferometric lithography, anodic etching, reactive ion etching, and PECVD oxide deposition techniques. Surface damage during reactive ion etching (RIE) processes can be eliminated by further selective etching employing dry- or wet-chemical etching processes. RIE-induced surface damage can also be eliminated by use of ion-implanted junctions. Plasma immersion doping techniques can be used to from junctions on deeply etched sidewalls, as can gas source, or solid source diffusions after RIE-damage removal treatments. The thin-film space solar cells of the present invention are expected to offer superior resistance to radiation and have significantly reduced weight due to removal of a majority of the photovoltaic material by etching.

Thus, in accordance with the teachings of the present invention, a random, and/or periodic subwavelength structure is etched through a significant fraction of the active region of a thin-film photovoltaic material such that light entering the volume of the material is predominantly absorbed within these deeply etched structures. A compromise is made between choosing a film thickness sufficiently narrow that ionizing radiation damage is minimized, while retaining sufficient light absorption by the remaining photovoltaic materials. This latter purpose is served by use of subwavelength (distances smaller than the wavelength of the incident light) non-periodic and periodic macroscopic surface structures to increase optical pathlengths, and microscopic structures to increase light absorption by waveguide-coupling.

Reference will now be made in detail to the present preferred embodiments of the invention examples of which are illustrated in the accompanying drawings. In what follows, identical callouts will be used for similar or identical structure.

Turning now to FIG. 1 hereof, a typical photovoltaic device, 10, designed in accordance with the teachings of the present invention is schematically illustrated. Three-dimensional periodic macroscopic features, 12a and 12b, are etched deeply into a thin film of photovoltaic material, 14, using procedures set forth hereinbelow to receive incident light. Typically, the thin film 14 comprises n- or p-doped silicon or gallium arsenide, shown in FIG. 1 between 15 μm and 50 μm thickness, 16, and surface features 12a and 12b each have a chosen width, 18, between 1 μm and 50 μm, a depth, 20, between 10 μm and 30 μm, and a spacing, 22, of between 0.5 μm and 5 μm. The surfaces, 24, receiving the incident light are n-doped (p-doped, if the film is n-doped silicon), 26. To enhance scattering into the photovoltaic material, and to reduce reflection, the surfaces receiving light, 24, and rear surface, 28, are randomly textured, 30a and 30b, and 32, respectively. The dimensions of the 3D volume periodic structure on the front surface of the solar cell are selected such that electron-hole pairs generated internal to the photovoltaic material, 34, by the incident light are collected by the vertical sidewall junctions, 36a and 36b, prior to recombination due to any radiation-induced volume damage in the material. Front-surface electrical contact, 38, and rear-surface electrical contact, 40, permit voltages to be measured and currents withdrawn from the photovoltaic material in accordance with standard measurement procedures.

Figure 2:
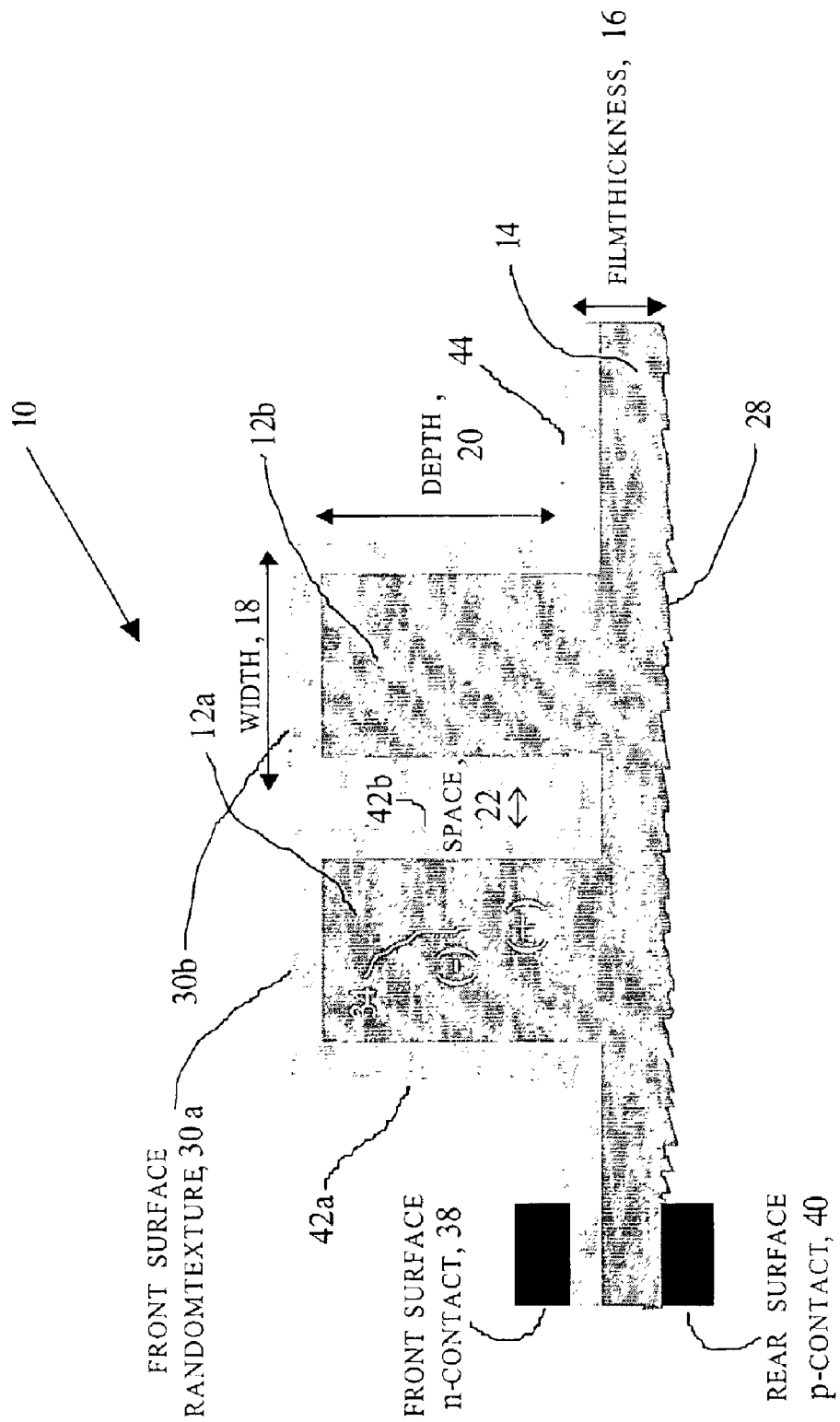
FIG. 2 is a schematic representation of a second embodiment of the radiation-tolerant, thin-film silicon photovoltaic device of the present invention showing subwavelength random microscopic structures etched onto the front, sidewall and back surfaces of the thin film.

FIG. 2 shows random texturing, 42, having been added to the sidewalls of macroscopic features 12a and 12b, and to the front surface, 44, of film 14.

Figure 3:
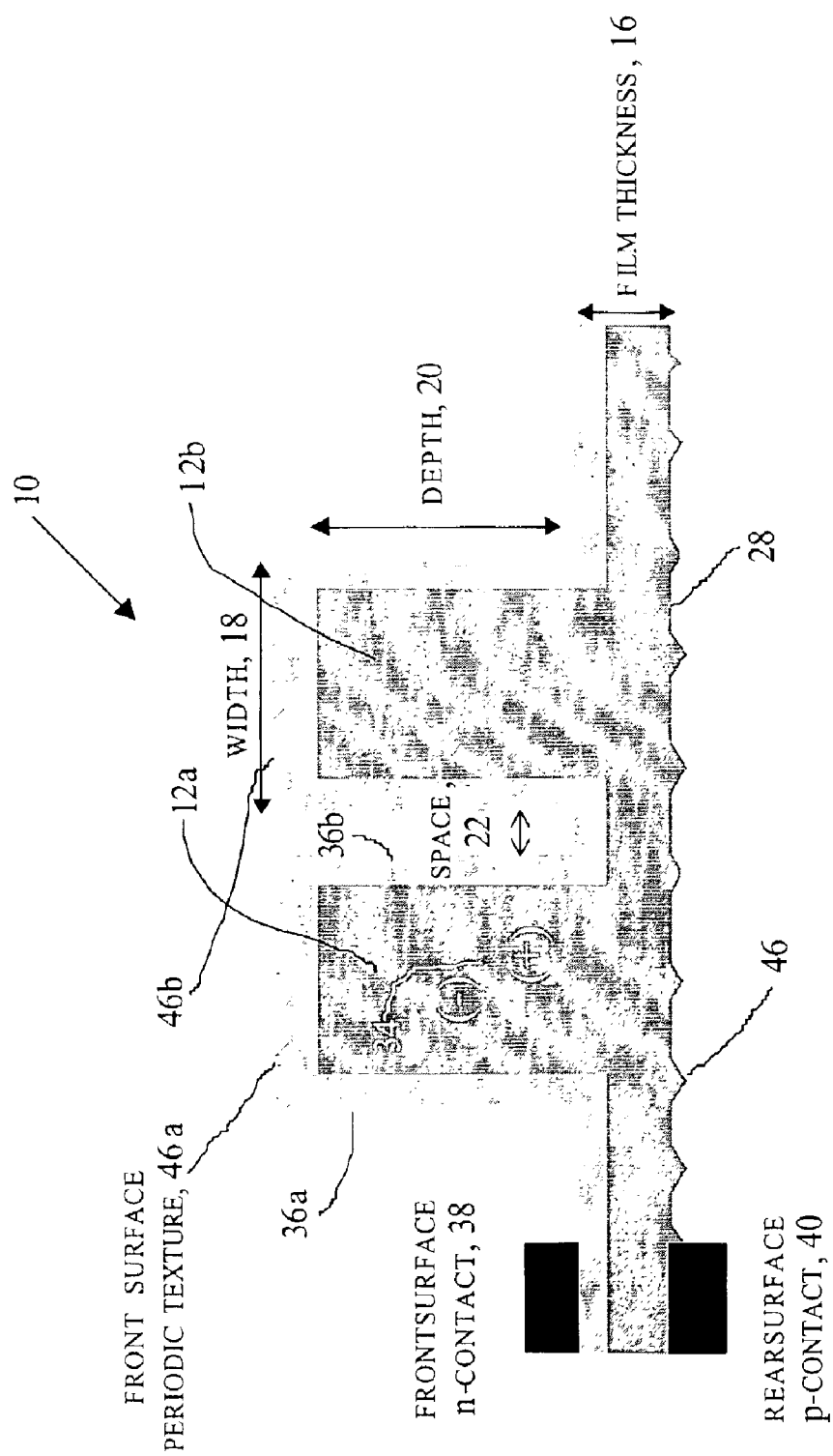
FIG. 3 is a schematic representation of a third embodiment of the radiation-tolerant, thin-film silicon photovoltaic device of the present invention showing subwavelength periodic microscopic structures etched onto the active light absorbing regions of the front and back surfaces of the thin film.

FIG. 3 shows another embodiment of the invention where similar objectives are achieved by replacing front and rear surface random texturing with suitably designed subwavelength grating microscopic structures, 46a and 46b, for diffracting the incident light into higher order modes which propagate in directions away from the normal to the surface of incidence, thereby improving absorption thereof.

Figure 4:
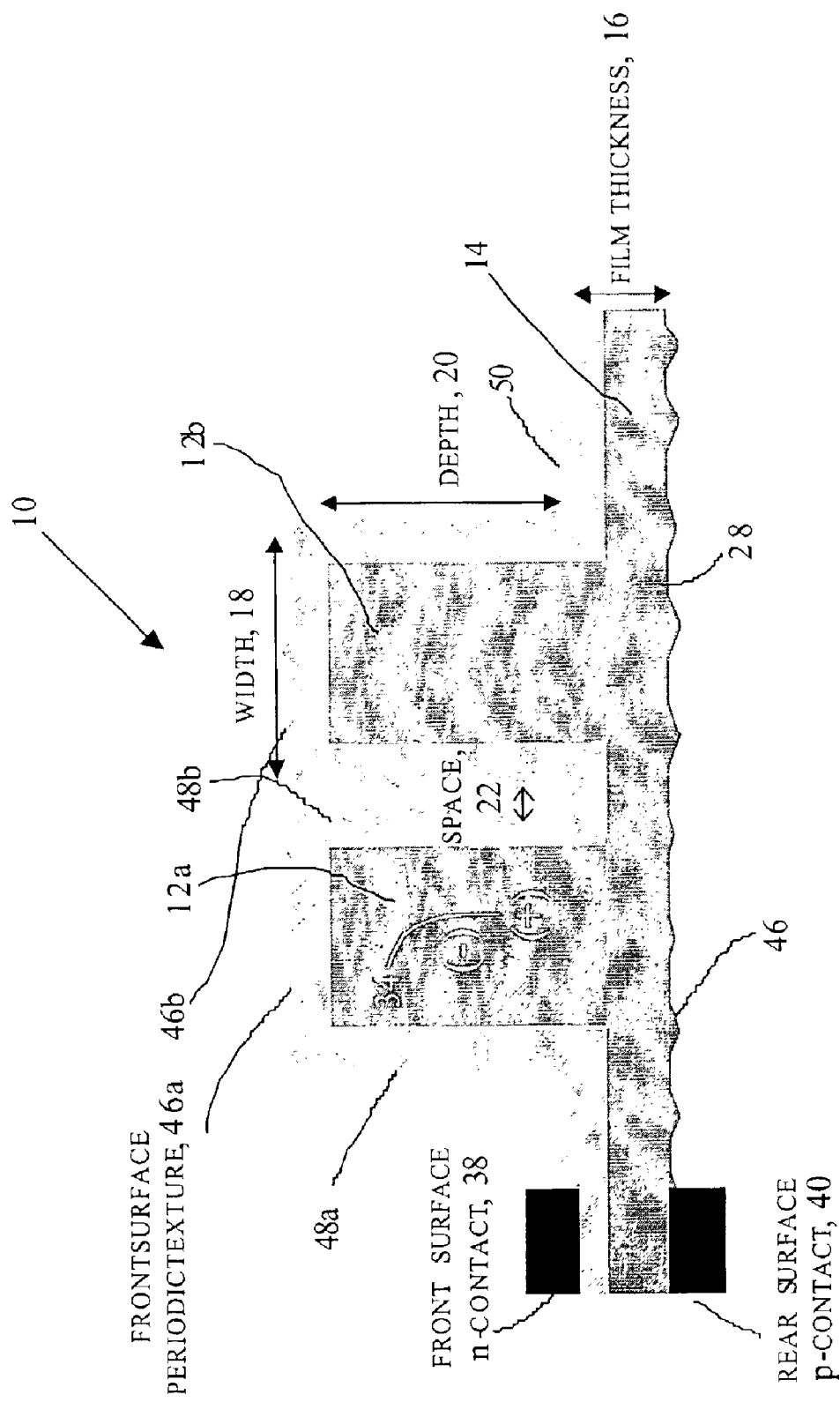
FIG. 4 is a schematic representation of a fourth embodiment of the radiation-tolerant, thin-film silicon photovoltaic device of the present invention showing subwavelength periodic microscopic structures etched on the front, vertical sidewalls, and back surfaces of the thin film.

The embodiment shown in FIG. 4 includes grating microscopic structures, 48a and 48b, along the vertical sidewalls of macroscopic features 12a and 12b, respectively, and to the front surface, 50, of thin film 14.

Figure 5:
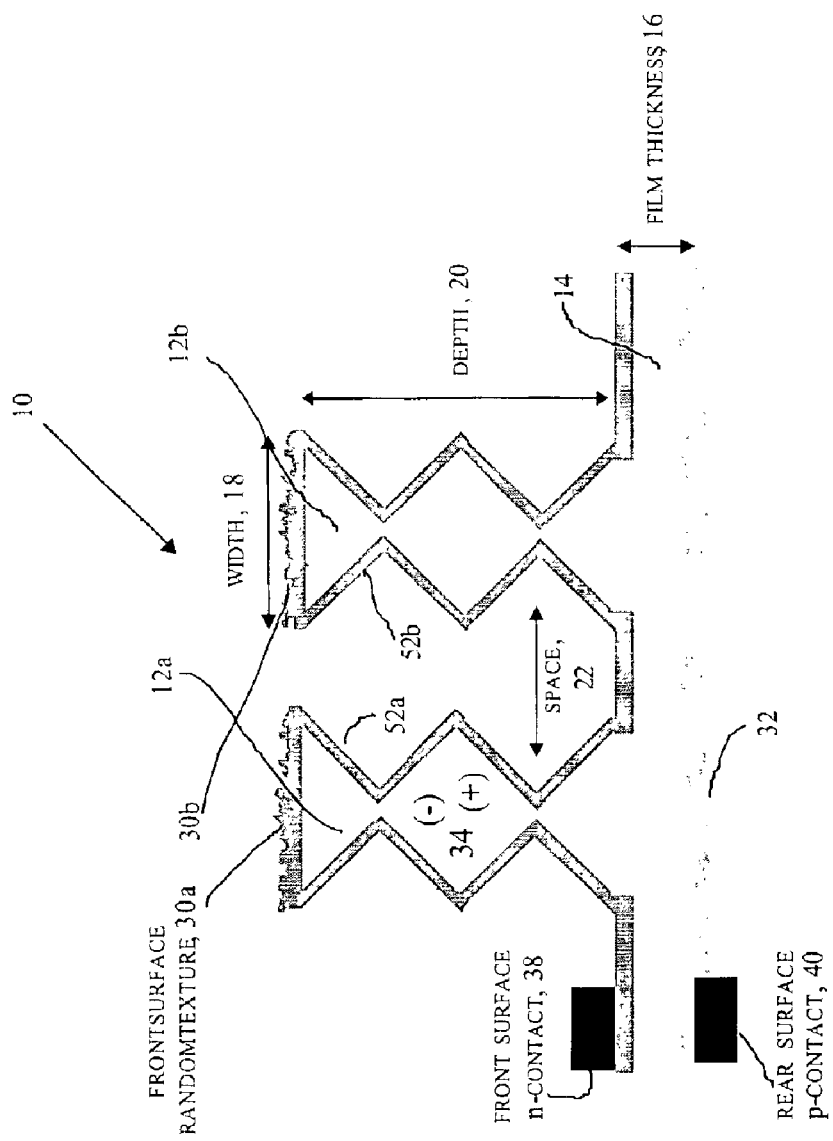
FIG. 5 is a schematic representation of a fifth embodiment of the radiation-tolerant, thin-film silicon photovoltaic device of the present invention showing inverted pyramids formed in the deep-etched portions of the film surface and front and back surfaces either being periodically or randomly textured.

FIG. 5 shows another embodiment for enhancing light trapping and carrier collection by forming several pyramids, 52a and 52b along the sidewalls of the feature structure, 12a and 12b, respectively.

In the photovoltaic device embodiments shown in FIGS. 1–5, hereof, light trapping is based on considerations of diffractive optics. Random, or periodic subwavelength microscopic structures scatter incident light into obliquely propagating diffraction orders that enhance absorption due to confinement by total internal reflection. The 3D macroscopic features 12a and 12b, formed for carrier collection, have smaller dimensions than minority carrier diffusion lengths.

For periodic microscopic structures smaller, or comparable in size to optical wavelengths, enhanced light absorption is achieved by waveguide mechanisms. For these microscopic structures, grating linewidths are ≦1.0 μm, and absorption is primarily within the individual grating lines. Because the electron-hole pairs are generated within ≦1-μm from the junctions, these cells are expected to be supremely radiation-tolerant provided high-quality shallow (<0.1-μm) junctions can be formed.

Figure 6:
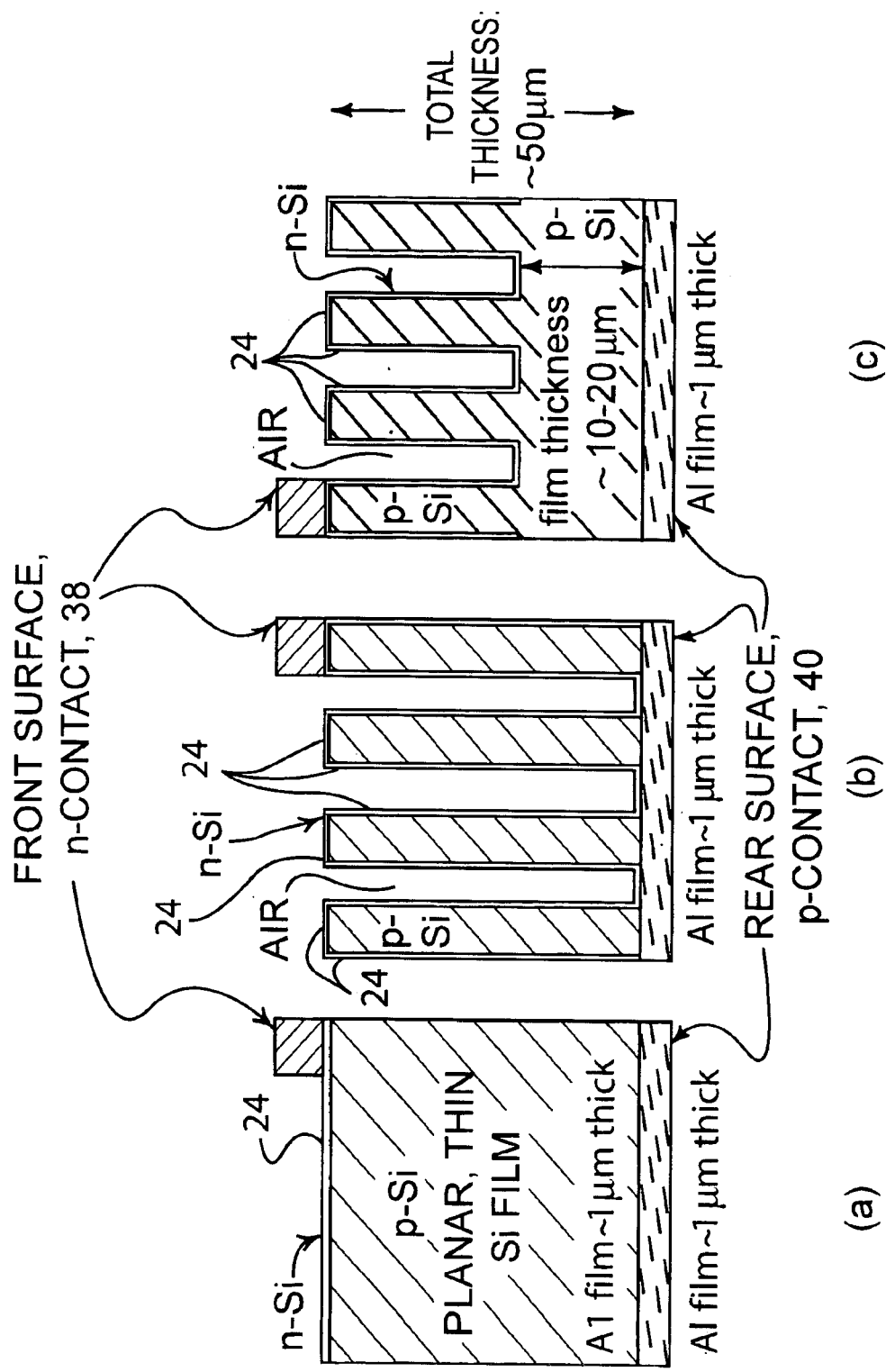
FIGS. 6a–6c illustrate three optical configurations for which absorption calculations have been performed for silicon thin-films; where

FIG. 6 shows two thin-film optical configurations for solar cells with subwavelength periodic grating microscopic structures, a planar film structure is shown for reference. FIGS. 6a–6c illustrate three optical configurations for which absorption calculations have been performed for silicon thin-films. FIG. 6a is planar reference film, FIG. 6b shows a grating structure etched the majority of the way through the thin film, while FIG. 6c shows a grating structure partially etched through the thin film.

1. Radiation-Tolerant Thin-Film Solar Cell Configurations a. Optical Confinement Using Diffractive Optics:

In order to enhance radiation tolerance of silicon solar cells in space, two technical issues have to be addressed:

(i) design of optical structures aimed for achieving complete light absorption in thin (≦50 μm) film structures, particularly in the near-IR (λ~0.9–1.1 μm) spectral region; and (ii) generation of three-dimensional (3D) emitter formations for collection of photo-generated electron-hole pairs in the surface and volume regions prior to recombination.

Enhanced near-IR absorption can potentially be achieved by complete randomization of the transmitted light inside a weakly absorptive medium. Yablonovitch has shown absorption enhancement in a weakly absorptive medium by as as $4n^2$ over a planar sheet, where n is the refractive index (See e.g., E. Yablonovitch, J.O.S.A. 72, 899 (1982)). Diffractive scattering of light by subwavelength microscopic structures helps realize this statistical limit (See e.g., H. W. Deckman et al., Appl. Phys. Lett. 42, 968 (1983)). Since a subwavelength random structure is a superposition of several grating periods having a wide range of profiles and depths, light incident on such a surface is diffractively coupled into many obliquely propagating beams leading to increased optical path lengths and absorption probabilities.

Enhanced EHP collection can be achieved by forming p-n junctions in the volume of the thin-film device regions to reduce the distance photo-generated carriers travel prior to collection at the junction. For example using low-cost optical lithography, anodic etching, and reactive ion etching techniques, p-n junction grid can be spaced to ~5-μm grid spacing, and etched through the entire thickness of the film FIG. 1 illustrates a typical top and bottom-contact thin-film solar cell. The front and back surface contacts are formed using appropriate metal stacks (see e.g., A. H. Fahrenbruch and R. H. Bube in *Fundamentals of Solar Cells*, Academic Press (1983)). Subwavelength random texture on front and back surfaces is combined with a macroscopic periodic grid aimed at collection of photo-generated electron-hole pairs. A junction is formed on the front surface following subwavelength random texturing, the doping type is opposite to the film doping. For instance, if the wafer is p-type, the junction will be n-type and vice versa. FIG. 2 describes another thin-film top and bottom-contact solar cell. In comparison with the cell structure described in FIG. 1, the subwavelength randomly textured microscopic structures are also extended to the sidewalls. This configuration will enhance light trapping due to diffractive scattering between top and bottom planes (z-axis), and in-plane scattering; that is, enhanced scattering in xy-plane.

FIG. 3 describes a thin-film cell configuration in which random subwavelength microscopic structures at the top and bottom surfaces are replaced by periodic microscopic structures. The thin-film solar cell structure in FIG. 4 is similar to that in FIG. 3 except for the extension of periodic microscopic structures to sidewalls. Periodic microscopic structures can be beneficially used for enhanced near IR light absorption (See e.g., Saleem H. Zaidi, J. M. Gee, and D. S. Ruby in IEEE PVSC-28, 395 (2000)).

FIG. 5 shows a novel optical confinement scheme in which inverted pyramids are formed along the volume of the thin-film structure. Most of the transmitted light within such surfaces is optically confined due to total internal reflection.

b. Optical Confinement Using Waveguide and Physical Optics:

For subwavelength periodic silicon microscopic structures etched through a thin film, enhanced light absorption resulting from waveguide and physical optics mechanisms can also be achieved. Light absorption in such microscopic structures was investigated using the commercially available grating modeling software GSOLVER™. FIG. 6 shows the three thin-film configurations: (a) planar; (b) grating only; and (c) composite grating and thin film structure, employed for absorption calculations. The back surface aluminum reflector serves both as the reflector and the back surface contact.

Figure 7:
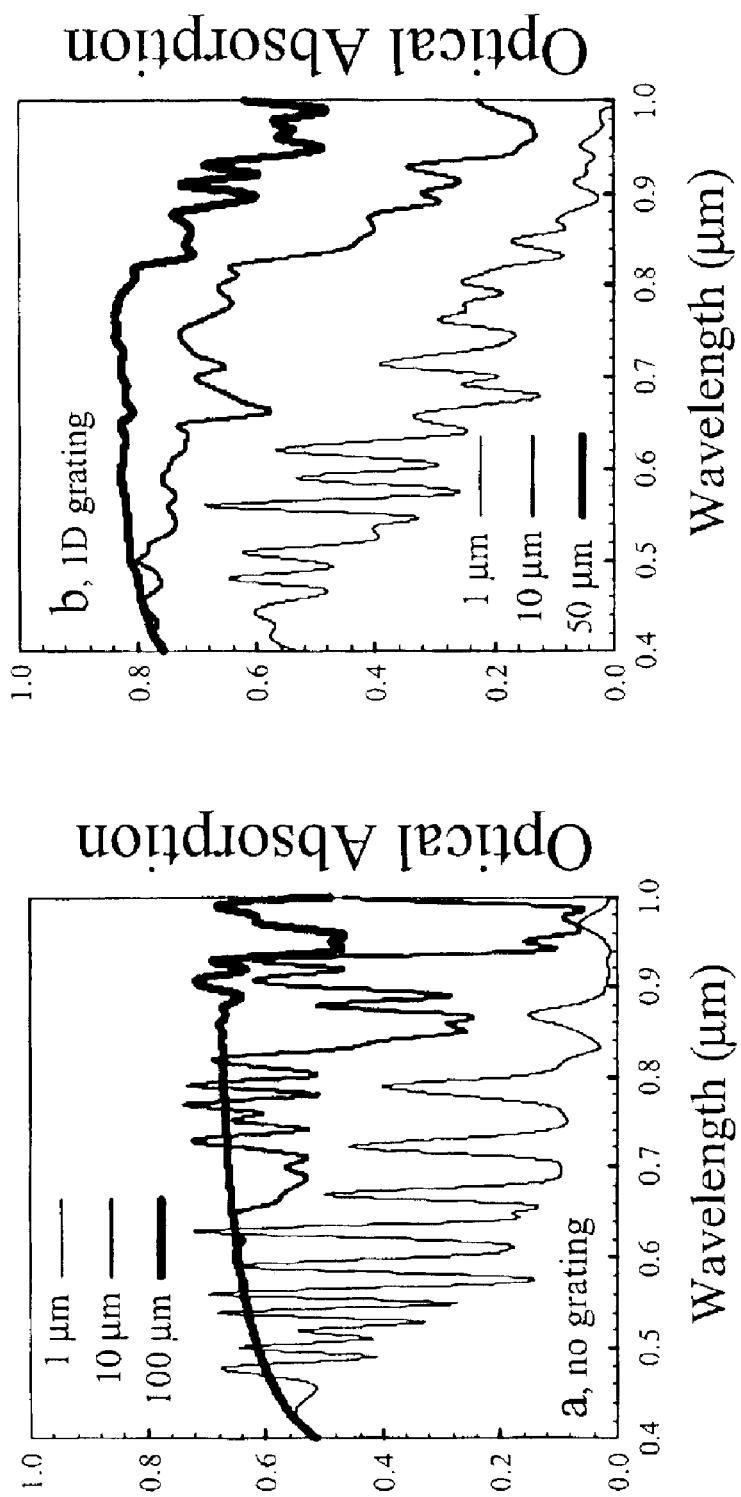
FIGS. 7a and 7b are graphs of calculated optical absorption as a function of wavelength for silicon on an aluminum substrate, FIG. 7a showing planar films having several thicknesses and FIG. 7b showing grating microscopic structures having several depths etched the majority of the way through to the aluminum substrate.
Figure 8:
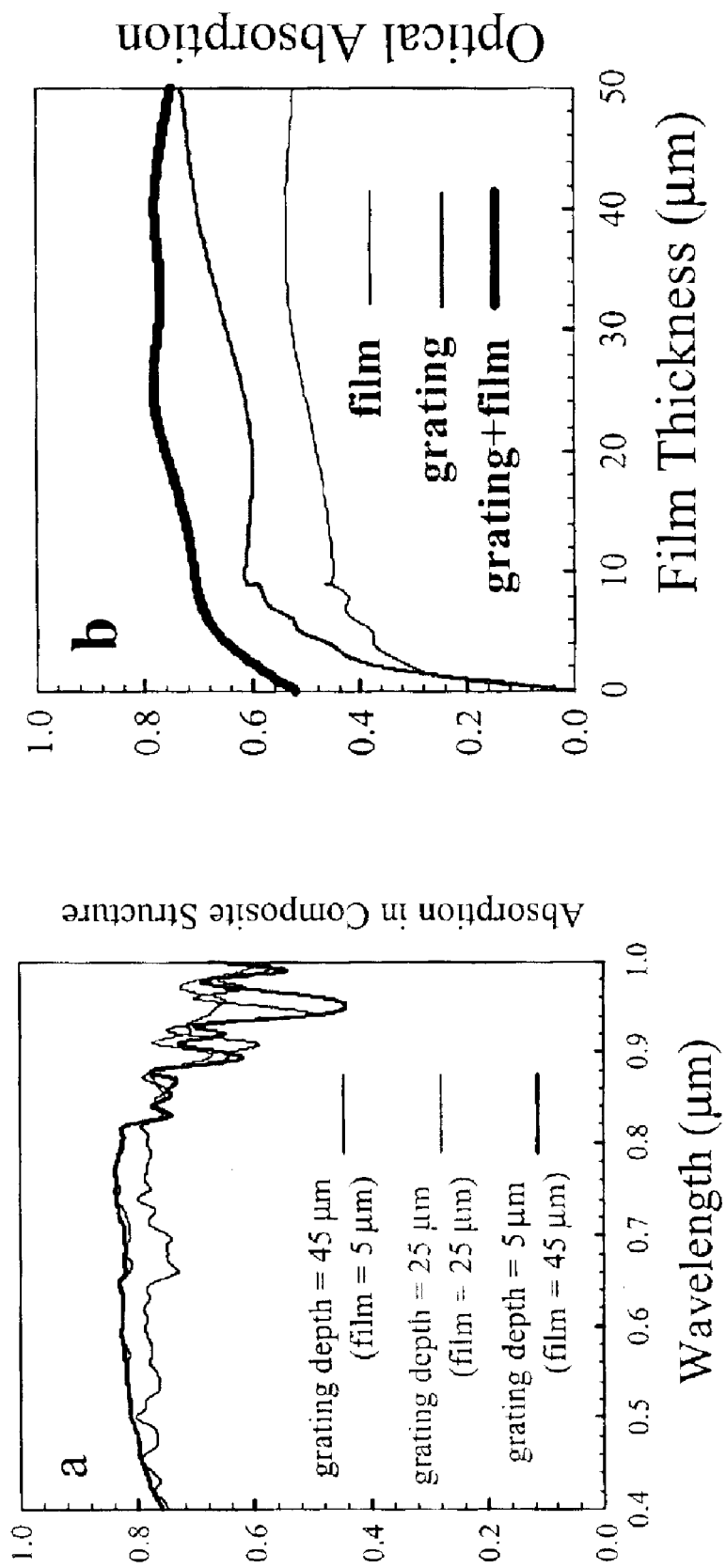

Optical absorption as a function of wavelength for various film thicknesses and grating depths is shown in FIG. 7. Absorption calculations are for 1D grating microscopic structures (FIG. 7b), with a 50% duty cycle, 0.8-μm period, and un-polarized, normally incident light. FIG. 7 shows that absorption increases as a function of film thickness, and reaches saturation for planar film thickness in ~100–200-μm range. For a 1D grating structure, absorption saturates at depths of ~50 μm. FIG. 8a is a graph of optical absorption as a function of wavelength for the composite grating structure. In this case, absorption saturates for grating depths in ~25–45-μm range. FIG. 8b plots averaged optical absorption as a function of thickness for the three configurations shown in FIG. 6. To be noticed is that the highest absorption is achieved for the composite grating and thin film configuration (FIG. 6c).

Figure 9:
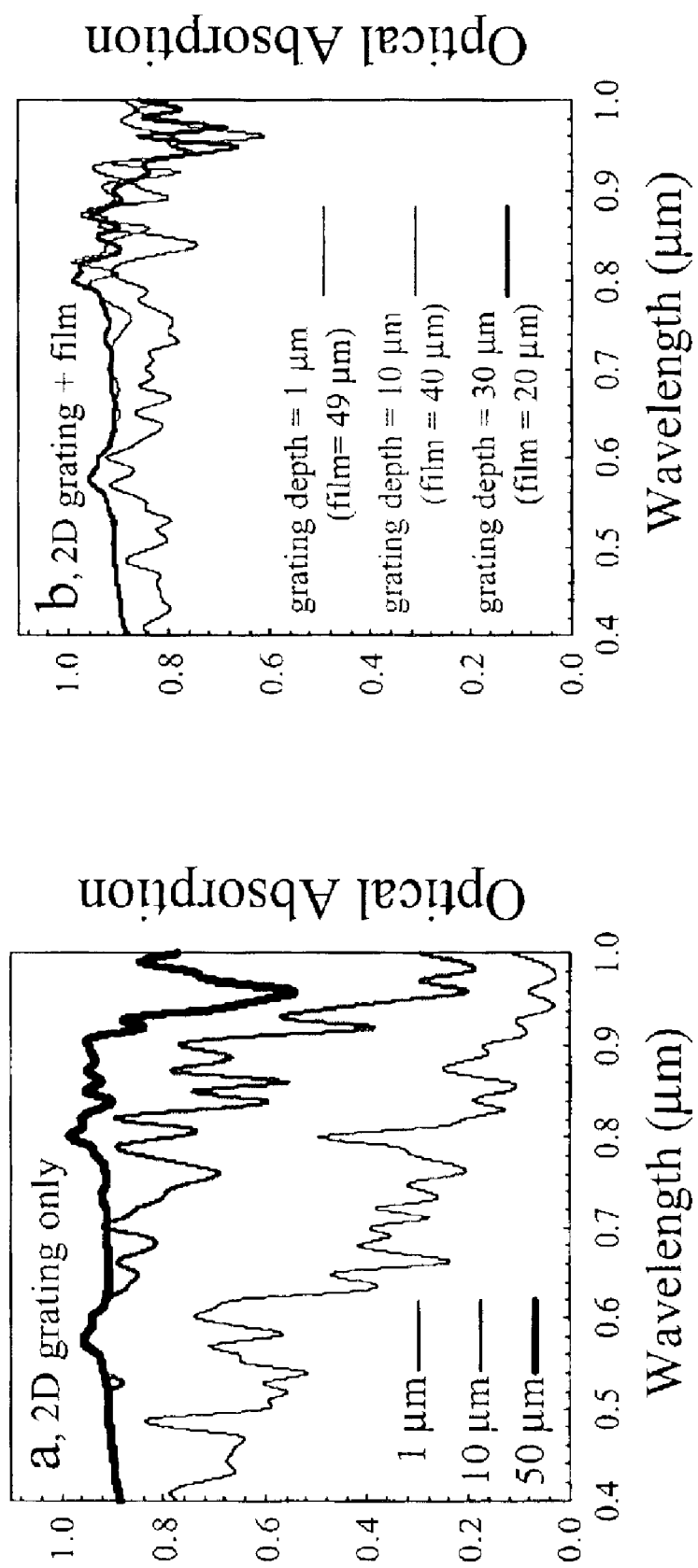
Figure 10:
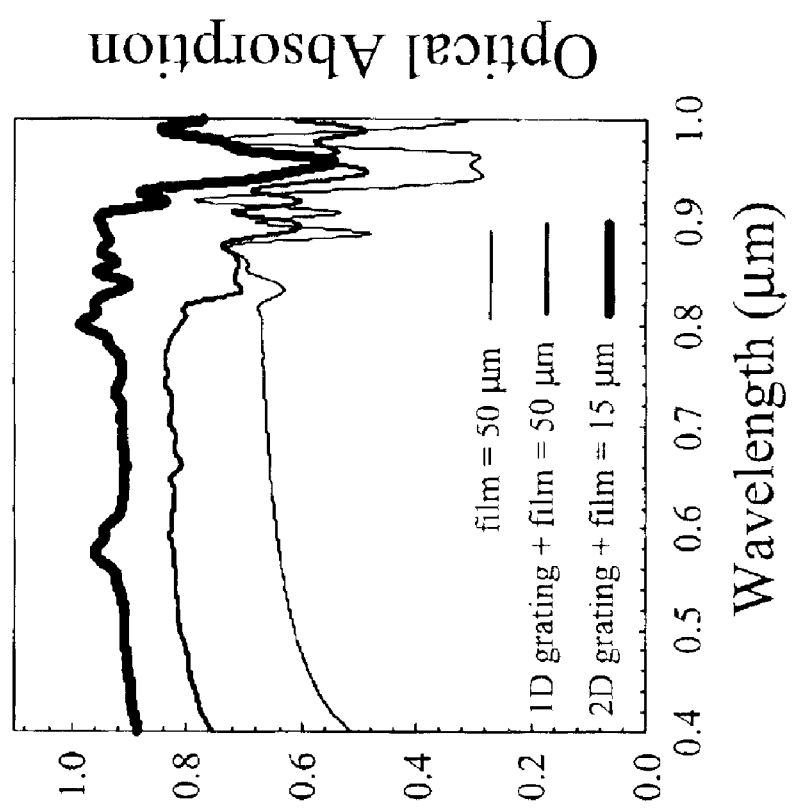
FIG. 10 is a graph of the optical absorption of 1D and 2D silicon grating microscopic structures having underlying films as a function of wavelength compared with the optical absorption of the underlying silicon film, the optical absorption in the 15-μm thickness with a 2D grating structure being higher than that for the 50-μm thick 1 D grating structure.

Since the sunlight is randomly polarized, it is important to evaluate two-dimensional grating microscopic structures, so that polarization effects are minimized. FIG. 9a is a graph of optical absorption for 2D, 0.8-μm period grating microscopic structures. To be noticed is that as the grating depth increases, the increase in absorption is more rapid than for the 1D grating case. FIG. 9b is a graph of the optical absorption for the composite case. Here the variation of absorption with grating depth is not as great. Comparison of absorption in 1D and 2D microscopic structures reveals that significantly higher absorption is achieved for the 2D patterns. FIG. 10 is a graph of absorption as a function of wavelength for planar, 1D, and 2D grating microscopic structures. It may be observed that the planar film has lowest absorption, and that a 2D pattern can achieve greater absorption when compared with 1D structure at ⅓ of the 1D composite film and grating thickness.

2. Fabrication of Subwavelength Microscopic Structures in Silicon

Figure 11:
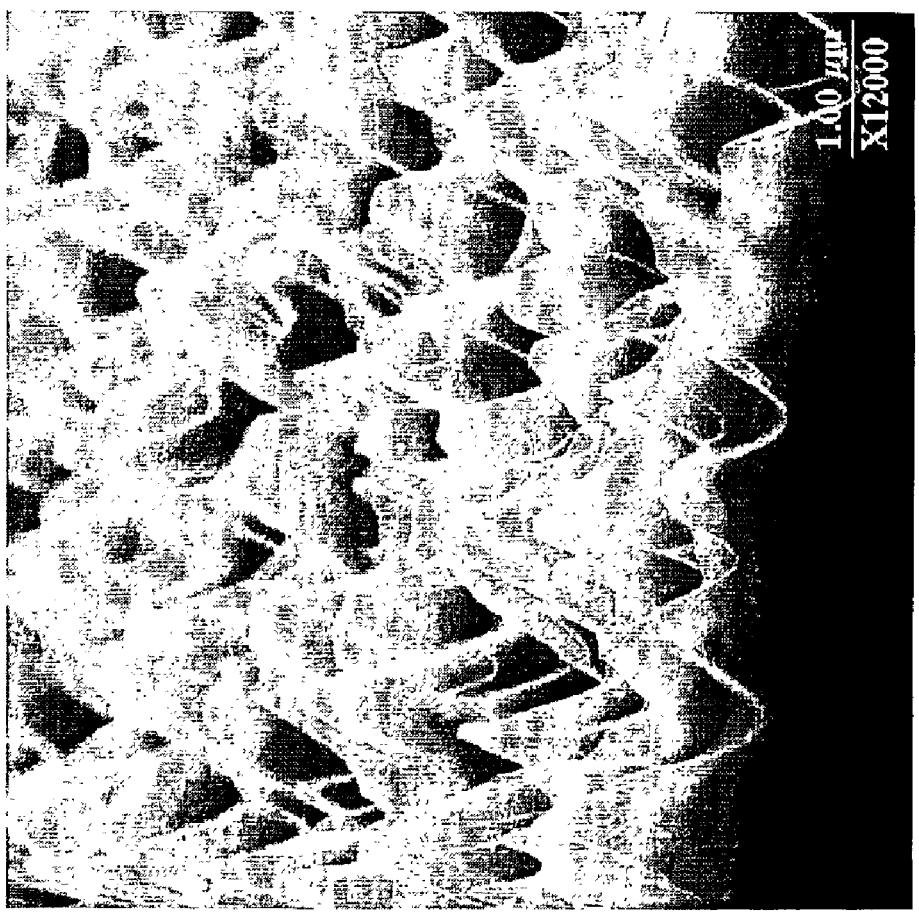
FIG. 11 is the output of a scanning electron microscope (SEM) for randomly textured, subwavelength 2D microscopic structures etched in silicon.

Random and periodic subwavelength microscopic structures can be conveniently formed using reactive ion etching and lithography techniques. Random reactive ion texturing techniques aimed at reducing silicon reflection and enhancing near-IR absorption have been extensively investigated for terrestrial solar cell applications (See, e.g., Saleem H. Zaidi, et al., IEEE Trans. Elect. Dev. 48, 1200 (2001)). FIG. 11 hereof shows a scanning electron microscope (SEM) output of a randomly textured silicon surface generated using reactive ion etching in an $SF_6/O_2$ plasma. Typical process parameters were: $SF_6$=14 sccm; $O_2$=16 sccm; pressure=170 mTorr; and Power=300 W. These types of microscopic structures are easily fabricated on the front and back surfaces of silicon solar cells as is described in FIGS. 3 and 4 hereof.

Subwavelength periodic grating microscopic structures can be most conveniently fabricated using laser interference techniques. A. Malag in Opt. Commun. 32, 54 (1980), and Saleem H. Zaidi and S. R. J. Brueck, in Appl. Opt. 27 (1988) describe typical fabrication techniques for simple one and two-dimensional microscopic structures. Interference between two coherent laser beams produces a simple periodic pattern at $d=\lambda/2 \sin\theta$, where $\lambda$ is the exposure wavelength, and $2\theta$ is the angle between the two intersecting laser beams. For $\lambda$=0.355 μm, $\theta$=60°, periods down to ~0.2 μm can easily be fabricated. Typically, grating microscopic structures are first formed in photoresist followed by pattern transfer to silicon using an appropriate combination of wet and dry etching techniques. Silicon reactive ion etching (RIE) techniques have been very well characterized; see, for example, P. M. Kopalidis and J. Jorne in J. Electrochem. Soc., Vol. 139 (1992) on Si etching in $SF_6/O_2$ plasmas. Wet-chemical etching of Si is also very well understood; see, for example K. E. Bean in IEEE Trans. Elect. Dev., ED 25, 1185 (1978).

Figure 12:
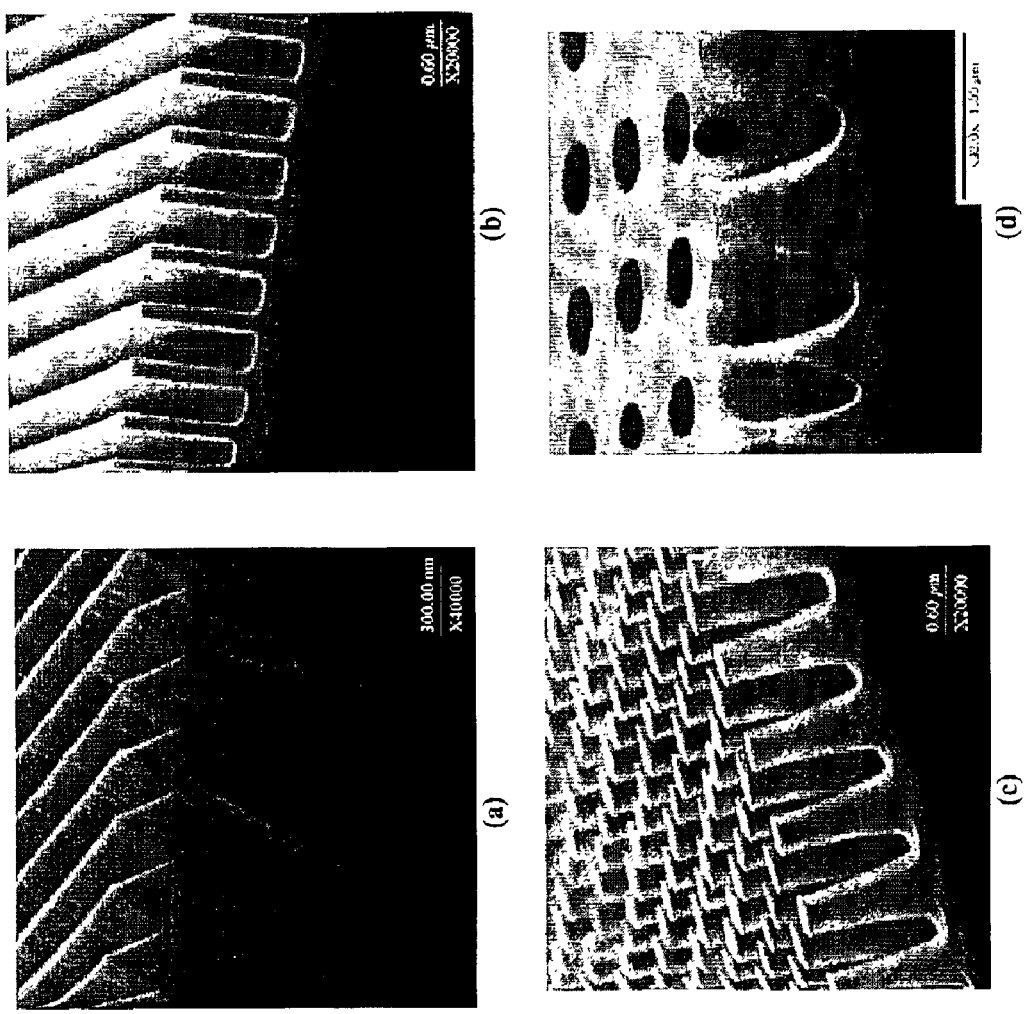
FIGS. 12a–12d are SEM outputs for different profiles etched in (100) silicon: (a) ~0.3-μm period triangular profile; (b) 1.0-μm period rectangular profile, (c) 2D post pattern having an 0.8-μm period; and (d) 2D hole pattern having an 0.8 μm period.
Figure 13:
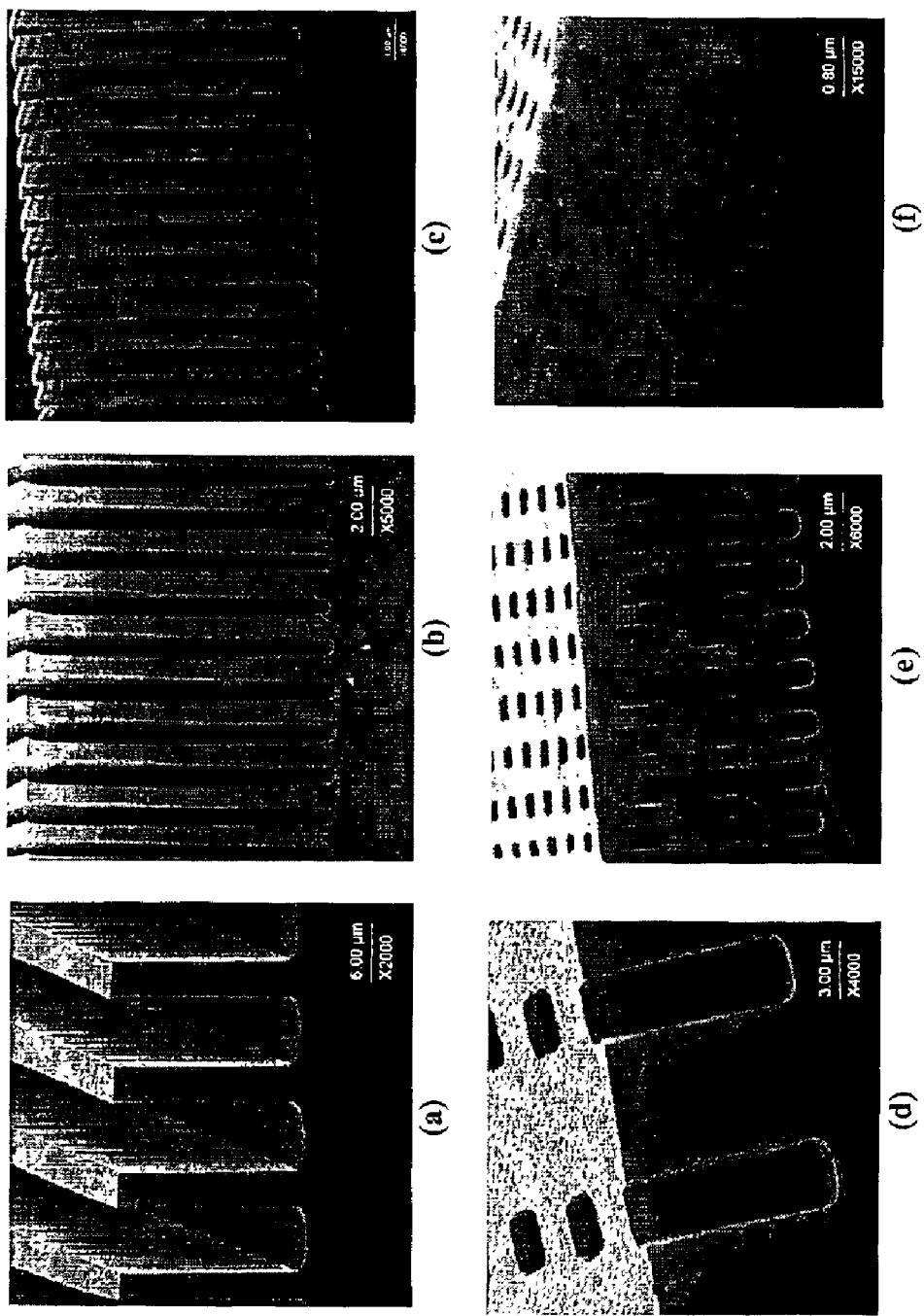
FIGS. 13a–13f are SEM outputs for deeply etched 1D and 2D grating structures silicon, where the structure shown in FIG. 13a is 20-μm deep with a 10 μm period; the structure shown in FIG. 10b is 10-μm deep with a 1.6-μm period; the structure shown in FIG. 10c is 7-μm deep with a 0.8-μm period; the structure shown in FIG. 10d is a 10-μm deep hole pattern having a 10-μm period; the structure shown in FIG. 10e is an 8-μm deep hole pattern having a 1.6-μm period; and the structure shown in FIG. 10f is a 3.5-μm deep hole pattern having a 0.8-μm period.

FIG. 12 shows SEM outputs for typical 1D and 2D grating microscopic structures. One-dimensional, triangular and rectangular profiles are shown in FIGS. 12a and 12b, respectively, and were formed by KOH and $SF_6/O_2$ reactive ion etching, respectively. For wet-chemical etching, a 40% KOH solution was used at room temperature. For reactive ion etching these gratings, the room temperature etching parameters were as follows: $SF_6$=14 sccm; $O_2$=12 sccm; pressure=50 mTorr; RF Power=50 Watt. The etch masks used were $SiO_2$ and Cr (~30 nm thick) respectively. Two-dimensional post and hole patterns formed using the same reactive ion etching parameters are shown in FIGS. 12c and 12d, respectively.

a. Deep Reactive Ion Etched Subwavelength Microscopic Structures:

Enhanced near-IR optical absorption and increased radiation tolerance is achieved by closely spaced, deeply (~10–50 μm) etched structures. Recent advancements in reactive ion technology make it possible to form such structures. FIG. 13 shows some examples of these deep reactive ion etched (DRIE) structures. FIG. 13a shows a 10-μm period, 1D pattern etched to a depth of ~20 μm, FIG. 13b shows a 1.6-μm period 1D grating etched to a depth of ~10 μm, FIG. 13c shows a 0.8-μm period 1D grating etched to depth of ~7 μm, FIG. 13d shows a 10-μm period, 2D hole pattern etched to a depth of 10 μm, FIG. 13e shows a 1.6-μm period, 2D hole pattern etched to depth of ~8 μm, and finally FIG. 13f shows a 0.8-μm period 2D hole pattern etched to depth of 3.5 μm. These structures demonstrate the feasibility of device concepts outlined in FIGS. 1–6.

Figure 14:
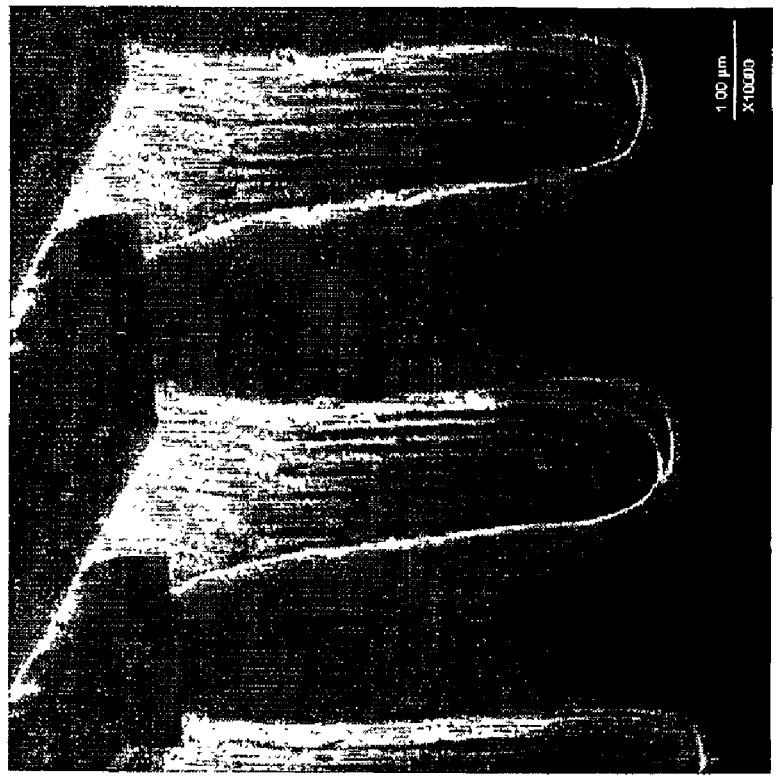
FIGS. 14a and 14b are SEM outputs for etch and deposition cycles, where the structure shown in FIG. 14a is formed by two etch and one deposition cycles, and the structure shown in FIG. 10b is formed by four etch and three deposition cycles.
Figure 14:
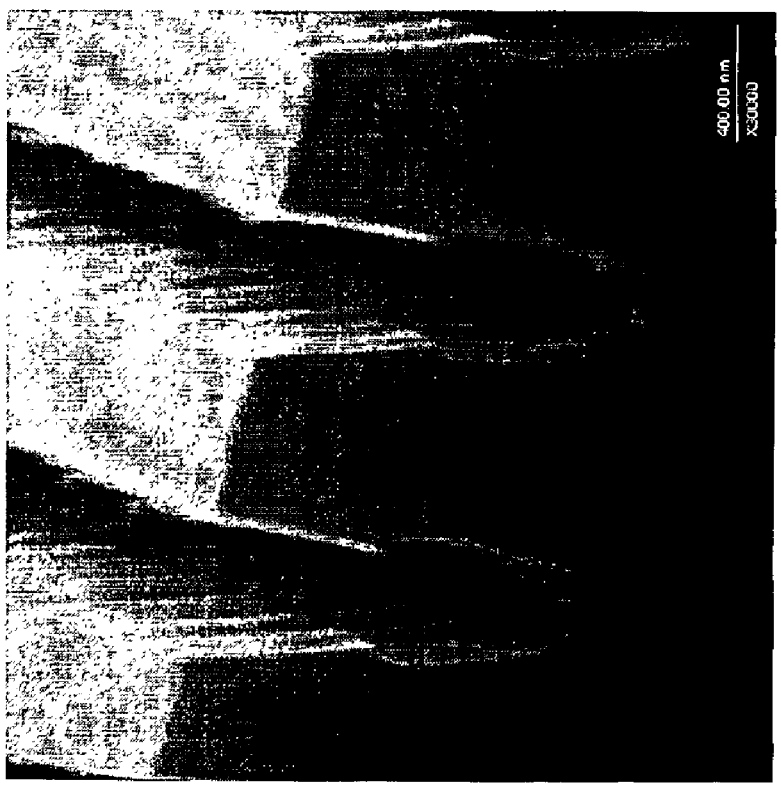

Techniques to form deeply etched grating microscopic structures based on low-cost, multiple etch and deposition cycles have been developed. FIG. 14 shows two examples of these etch and deposit reactive ion etching cycles. FIG. 14a shows grating structure formed using two reactive ion etchings and one plasma enhanced chemical vapor deposition (PECVD) oxide process; a reactive ion etching (RIE) step is followed by PECVD oxide deposition, followed by a second reactive ion etch step. The PECVD oxide deposition parameters used were: pressure=5400 mTorr; $SiH_4$=400 sccm; $N_2O$ =450 sccm; He=450 sccm; and RF power=30 Watt. The oxide film on the sidewalls is required to prevent lateral etching, and helps achieve almost vertical sidewalls. FIG. 14b shows grating profiles formed following four RIE and three PECVD deposition steps. These results demonstrate that the device microscopic structures proposed in FIGS. 1–6 can be fabricated by a suitable combination of RIE and PECVD oxide deposition steps.

Figure 15:
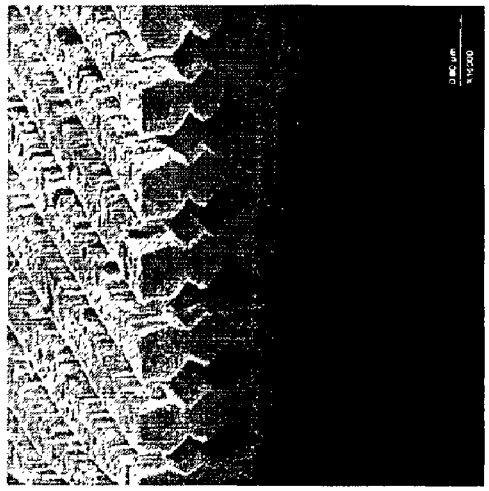
FIGS. 15a–15c are SEM outputs for several periodic subwavelength microscopic structures on the sidewalls of a 1D grating.
Figure 15:
Figure 15:
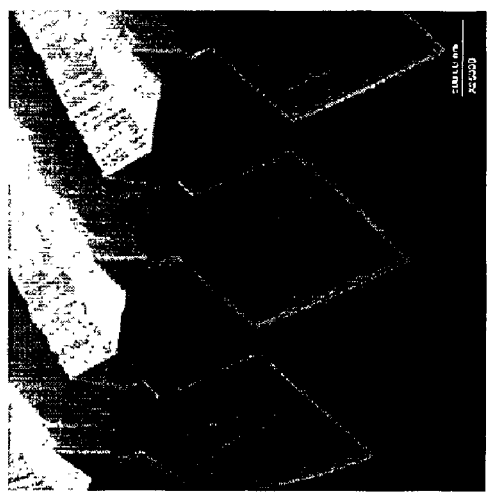
Figure 16:
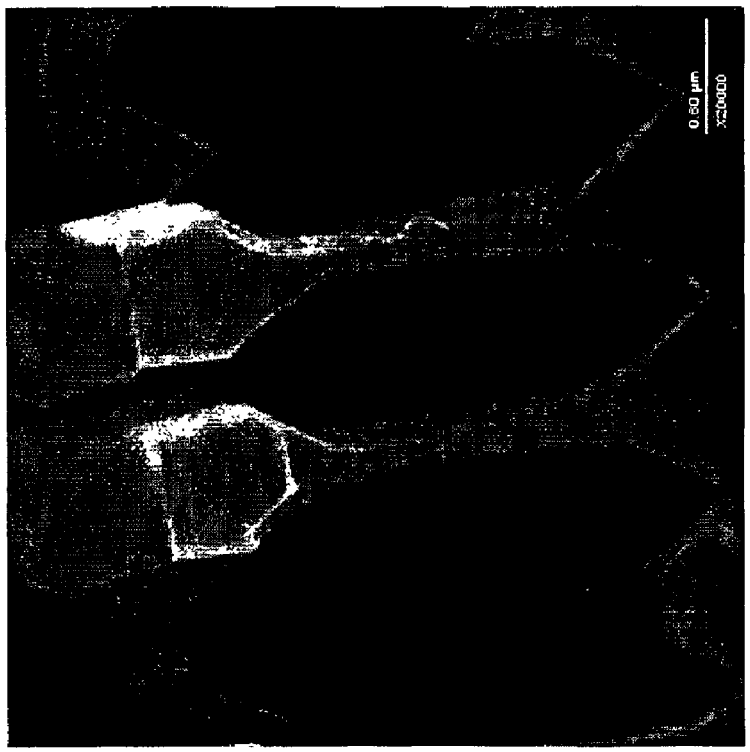
FIGS. 16a and 16b are SEM outputs for randomly textured subwavelength microscopic structures on the sidewalls of a 1D grating structure.
Figure 16:
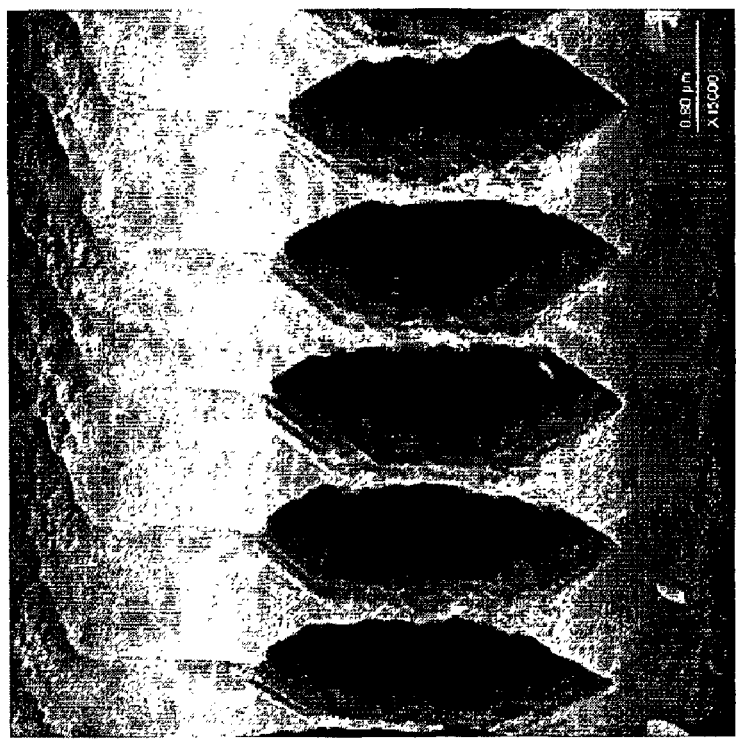

The RIE and deposition processing sequences outlined in FIG. 14 also allow periodic sidewall microscopic structures having desired periodicity and profiles to be generated. FIG. 15 shows examples of vertical grooved sidewall microscopic structures formed by a combination of reactive ion etching, PECVD deposition and KOH etching. To be observed is that only two KOH cycles were employed in FIGS. 15a and 15b, and one in FIG. 15c. By repeating these etch and deposition cycles, periodic gratings can be etched all the way through a thin film structure. FIG. 16 shows formation of random subwavelength microscopic structures on the vertical sidewalls similar to the front surface microscopic structures shown in FIG. 11.

b. Anodic Etching Techniques for Subwavelength Microscopic Structures:

The electrochemical etching of Si in HF solutions is a well-known method for porous Si formation (See, e.g., D. R. Turner, J. Electrochem. Soc. 105, 402 (1958)). For deep etching, the macroporous silicon formation method in n-type Si appears to be highly desirable (See, e.g., V. Lehman, J. Electrochem. Soc. 143, 385 (1996), and H. Ohji et al., Sensors and Actuators 82, 254 (2000)). In n-type (100) Si, holes as minority carriers are responsible for etching reaction. In a typical experimental configuration, light illumination from the back surface generates holes there which diffuse to the front surface. Since the electric field is strongest at the pore tip, a majority of holes are consumed at the tip resulting in near vertical etching of the Si. Therefore, in lightly doped n-type Si, anisotropic etching is primarily attributed to hole-depletion effect. For p-type Si, the holes are already in the majority, so no illumination is required. However, in order to achieve anisotropic vertical etching, surface passivation agents are required. Recent work has demonstrated that profiles similar to n-type Si may be possible in p-type Si as well (See e.g., R, B. Wehrspohn et al., J. Electrochem. Soc. 145, 2958 (1998)).

Figure 17:
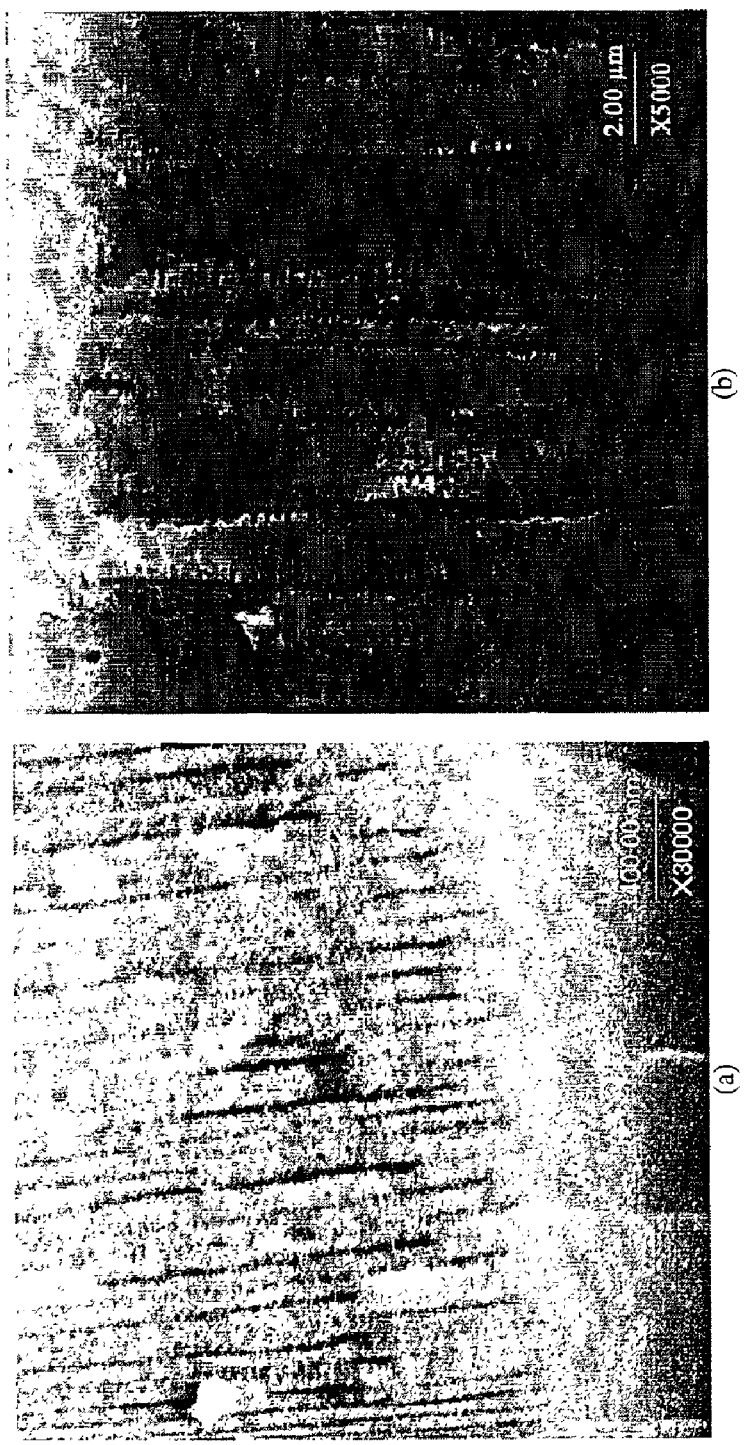
FIGS. 17a and 17b are SEM outputs for anodically etched surfaces.

For either n, or p-type Si, anodic etching is a complex function of wafer resistivity, crystal orientation, surface preparation, current density, and illumination intensity. For space solar cells, anodic etch processes for wafers with resistivities in the range of 10–20 ohm-cm need to be more extensively developed. FIG. 17 shows two examples of anodic etching in (100) n-type Si showing vertical trenches with depths in the 8–13 μm range and widths in the 0.05 to ~0.3 μm range. These results demonstrate the potential of the anodic etching process as a low-cost, high throughput alternative for slow and expensive DRIE techniques. Another important consideration, particularly for solar cell applications, is the absence of plasma-induced surface damage.

3. Characterization of Subwavelength Periodic Microscopic Structures in Silicon

Figure 18:
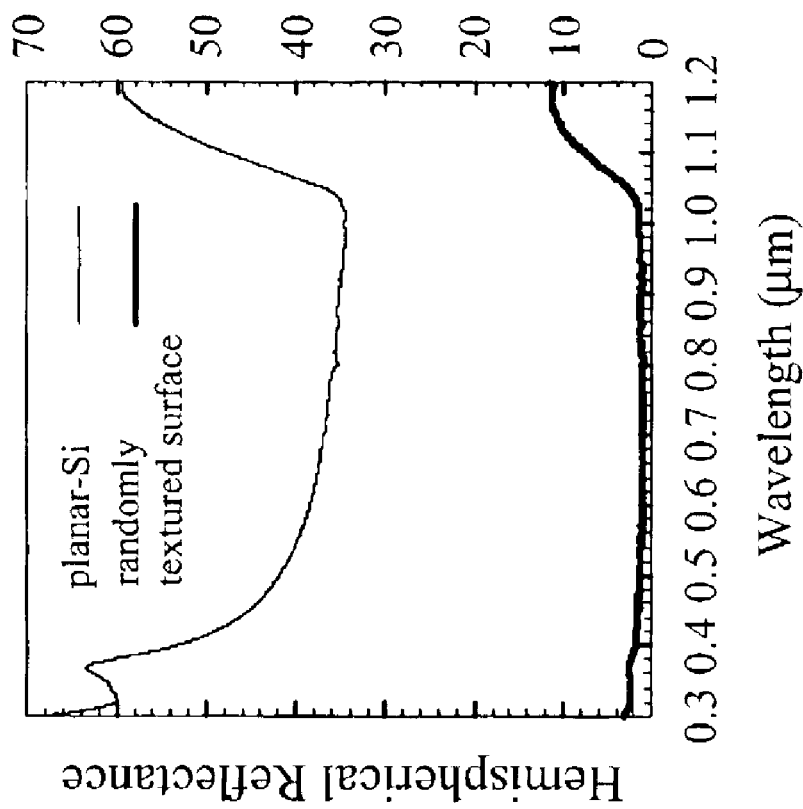
FIG. 18 is a graph of hemispherical spectral reflectance from randomly distributed subwavelength silicon surfaces as a function of wavelength.

Spectral reflectance measurements provide information about refection and absorption characteristics of subwavelength random and periodic microscopic structures. FIG. 18 shows hemispherical reflectance measurements from the random textured Si surface shown in FIG. 11. It is seen that overall reflection has been reduced to ≈1% for wavelengths <1 μm, with increasing reflectance at wavelengths >1 μm which represents light transmitted from the wafer and reflected into the detector. For comparison, hemispherical reflectance from the planar Si surface is also shown.

Figure 19:
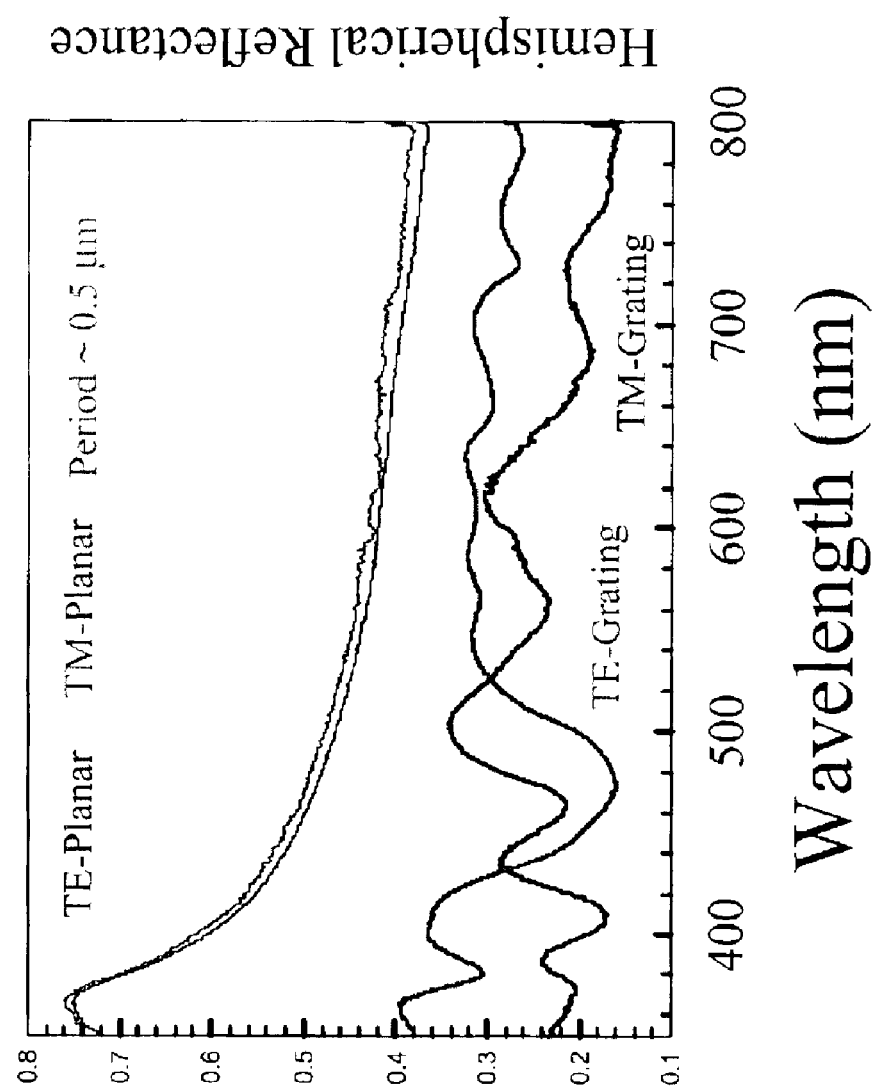
FIG. 19 is a graph of hemispherical spectral reflectance from 1D, 0.5 μm period subwavelength silicon grating surfaces as a function of wavelength.

Generally, for rectangular periodical profiles, narrow, low reflectance spectral bands are observed. For the 0.5-μm period structure shown in FIG. 12b, FIG. 19 is a graph of the hemispherical spectral reflectance for electric field parallel (TE) and perpendicular (TM) to the grating lines. It is seen that TM-reflectance is lower than TE, and resonance reflection minima for two polarizations don't occur at the same wavelengths. For both polarizations, overall reflection is lower than the planar surface. Since for a period of 0.5-μm, there are no radiative diffraction orders at wavelengths >0.5 μm, all the light lost in reflection is transmitted into the Si substrate and distributed into various diffracted orders. Calculations by the present inventor using GSOLVER™ predict similar reflectance response for deeply etched grating microscopic structures.

4. Performance of Grating Solar Cells

Figure 20:
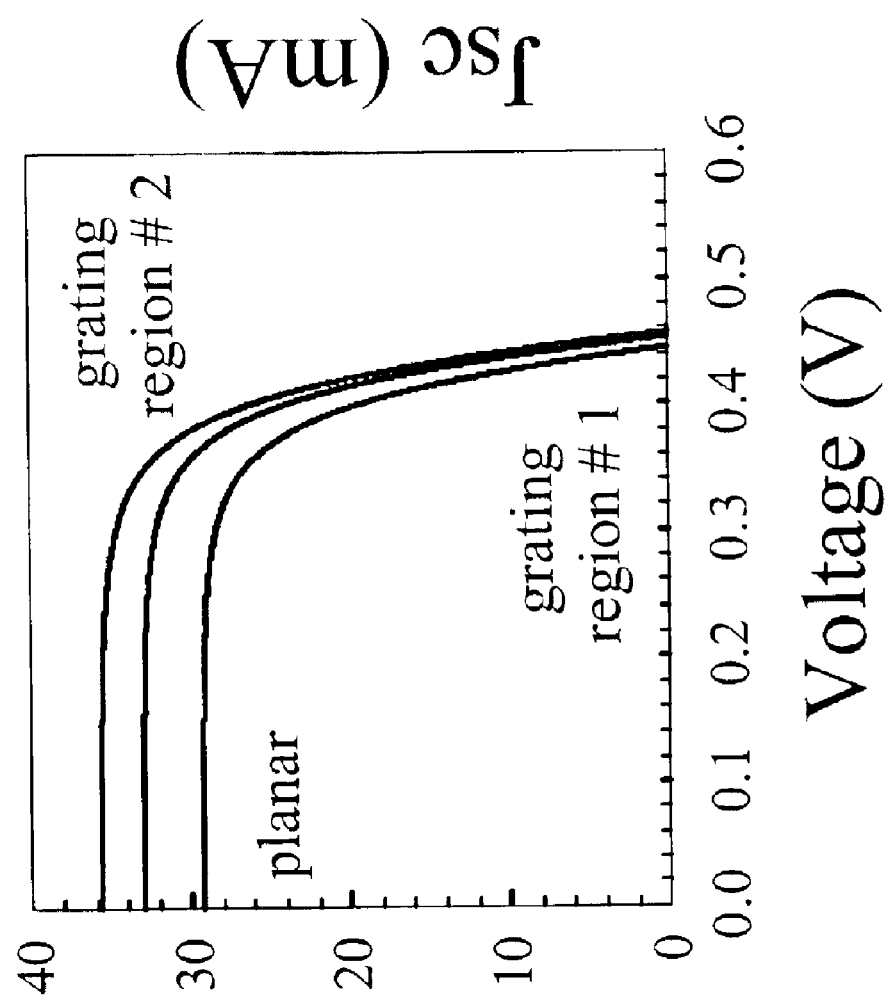
FIG. 20 is a graph of one sun LIV measurements under AM0 conditions from ~1 μm deep, 1D grating solar cells

Grating solar cells, or photodetectors can be made by simply adding laser interference lithography and RIE/deposition steps to the device fabrication sequence described hereinabove (See, for example, A. H. Fahrenbruch and R. H. Bube in *Fundamentals of Solar Cells*, Academic Press (1983)). FIG. 20 presents preliminary data, but no attempt has been made to optimize junction, contacts and grating profiles. FIG. 20 plots one-sun (AM0) light current voltage (LIV) measurements from ~0.25–1.0-μm deep; 0.8-μm period grating solar cells. For comparison, planar surface response is also shown. It is seen that for grating structure #2, short-circuit current ($J_{SC}$) is increased by ~1.6 mA/cm² in comparison with a planar surface. The current response of grating structure #1 is lower than planar surface. The low, open-circuit voltages ($V_{OC}$) and fill factors are likely due to the lack of optimum junction formation on grating surfaces (See, e.g., Saleem H. Zaidi et al., IEEE PVSC 29 (2002)).

Figure 21:
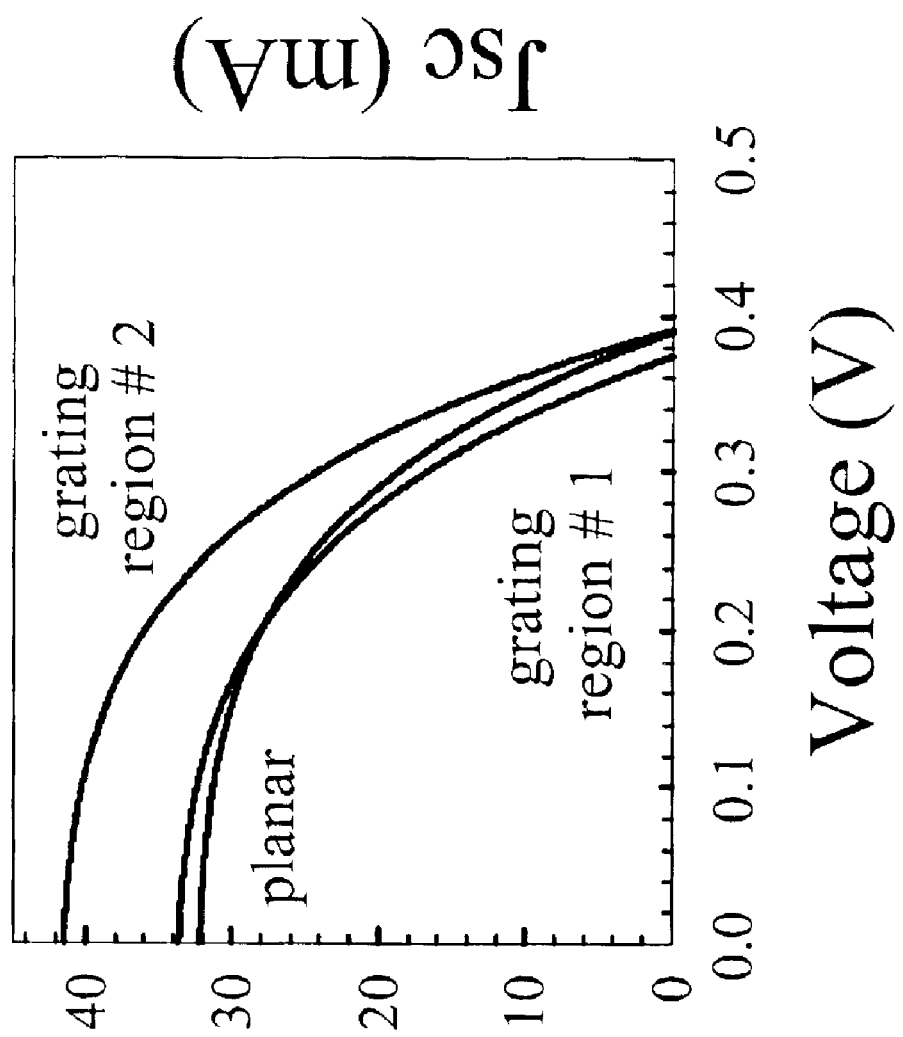
FIG. 21 is a graph of one sun LIV measurements under AM0 conditions from ~10 μm deep, 2D grating solar cells.
Figure 22:
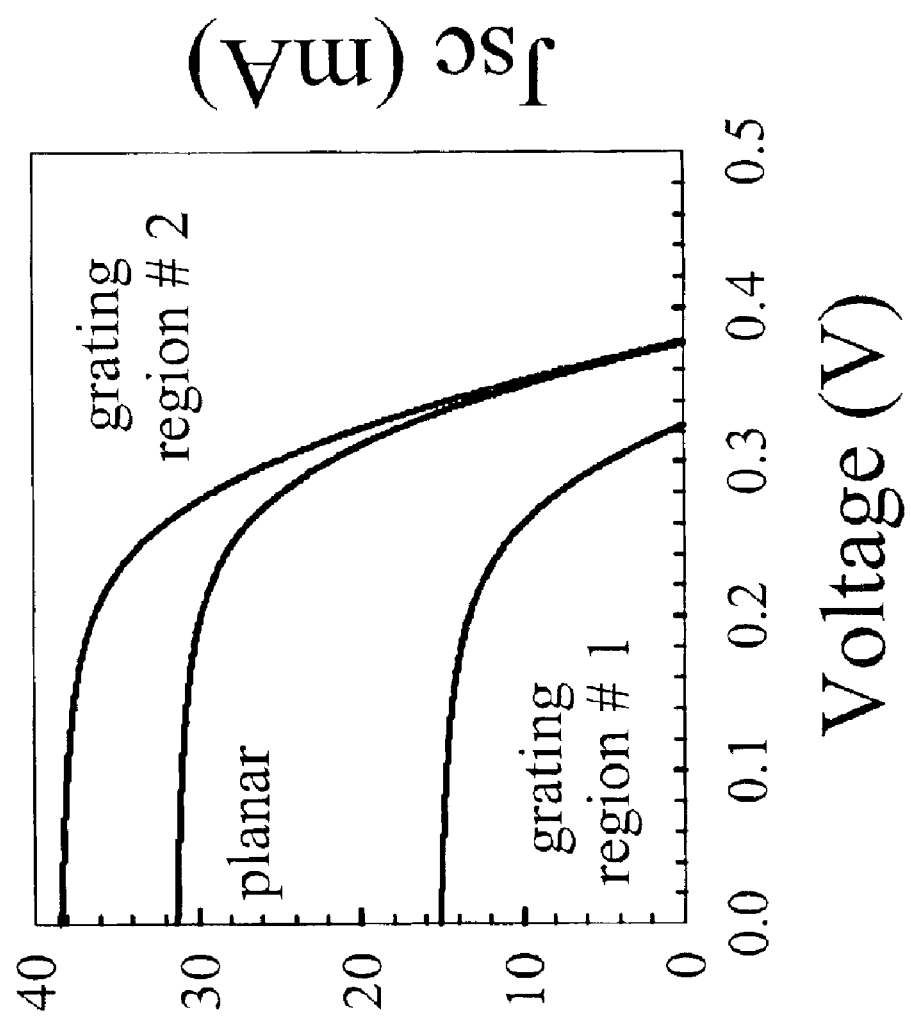
FIG. 22 is a graph of one sun LIV measurements under AM0 conditions from ~10-μm deep 1D grating solar cells.
Figure 23:
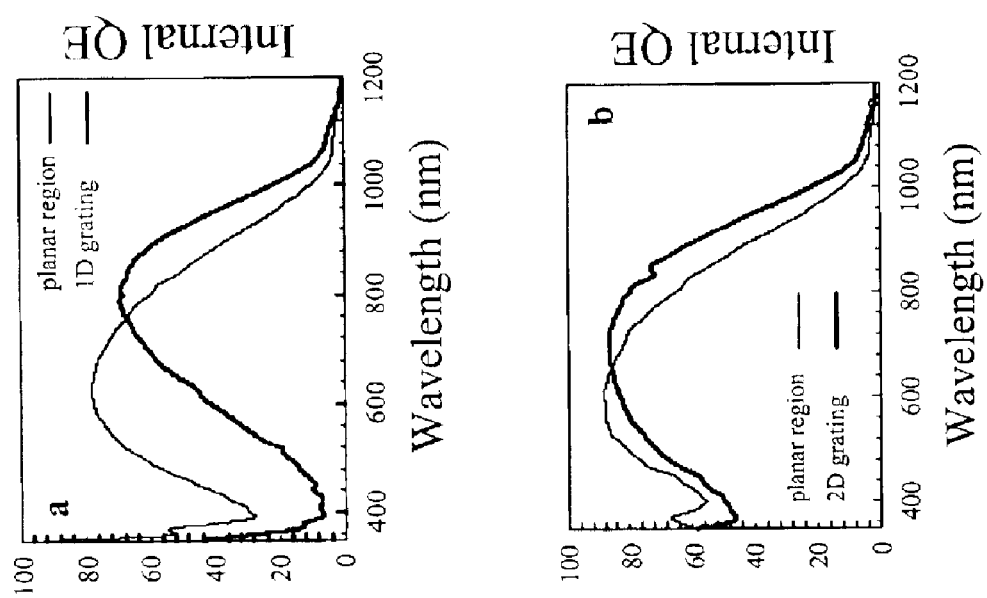
FIGS. 23a and 23b are graphs of spectral response from 1D (FIG. 23a) and 2D (FIG. 23b) grating solar cell structures formed using deep reactive ion etching to an approximately 10-μm depth, as a function of wavelength.

FIG. 21 shows AMO LIV measurements from 10-μm period (grating region #2) and 0.8 μm period (grating region #1) 2D grating microscopic structures shown in FIG. 13d and FIG. 13f, respectively. It is seen that the 10 μm period structure has enhanced $J_{SC}$ by ~9.8 mA/cm$^2$ in comparison with the planar surface, whereas the 0.8 μm period response is only slightly improved. This is likely due to lack of optimum junction formation on extremely thin microscopic structures. FIG. 22 shows AM0 LIV measurements for a 10 μm period 1D (grating region #2, FIG. 13a) and an 0.8-μm period (grating region #1, FIG. 13c) 1D grating structure; for comparison, planar surface response is also shown. It is again observed that 10 μm period structure has enhanced $J_{sc}$ by ~6.5 mA/cm$^2$, whereas the 0.8 μm period structure has significantly lower performance. FIG. 23 plots spectral response of 1D (FIG. 23a, grating region #2, FIG. 22) and 2D gratings (FIG. 23b, grating region #2, FIG. 21) and, for comparison, planar surface response is plotted. It is seen that spectral response of 1D grating microscopic structures is poor in most of the UV-Visible region. In comparison with 1D grating structure, 2D hole pattern exhibits significantly superior performance. The degradation of short wavelength response may be due to RIE-induced surface damage.

In summary, the grating solar cell data shows that significant performance gains can be achieved using appropriately designed grating microscopic structures, removal of RIE-induced surface damage, and optimization of p-n junctions.

a. Removal of RIE Surface Damage:

The spectral response measurements in FIG. 23 illustrate that some photo-generated carriers are lost to RIE-induced surface damage. RIE-induced surface damage has been extensively investigated. For example, S. W. Pang et al. in J. Appl. Phys. 54, 3272 (1983) have identified several ways of removing surface damage. More recently, D. S. Ruby et al., 28$^{th}$ IEEE PVSC, 75 (2000) describe removal of RIE damage on randomly textured Si surfaces using a 40% KOH and nitric acid (Nitric acid: hydrofluoric acid: water in 10:1:8 volume ratio) for room temperature etch times of ~60–300 and 10–20 s, respectively. By incorporation of damage-removal etch (DRE) treatments, textured region IQEs identical to planar surfaces have been regenerated. FIG. 12 hereof shows the SEM output for as-RIE etched rectangular profiles following RIE and PECVD oxide deposition cycles. By incorporating KOH, or nitric etch treatments, well-defined grating (FIG. 15) and random microscopic structures (FIG. 16) can be produced, both of which help confine light while removing the RIE-induced surface damage. This etching procedure therefore removes sidewall surface damage as well as providing controllability for the light interaction due to inverted pyramid structures.

Figure 24:
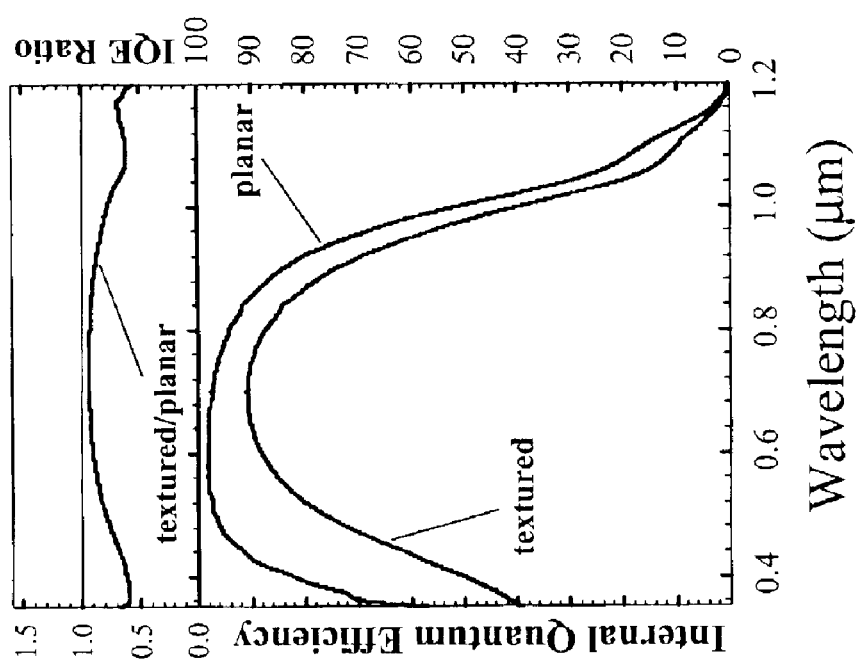
FIG. 24 is a graph of internal quantum efficiency from randomly distributed, subwavelength-structured solar cells formed using gas-source diffusion; planar surface response is shown for comparison.
Figure 25:
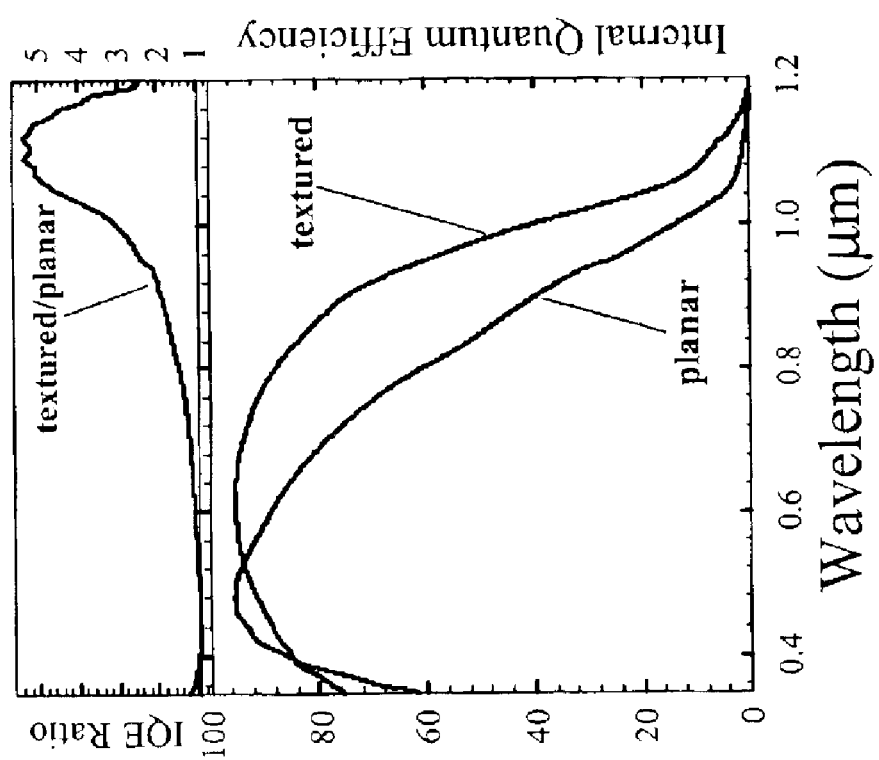
FIG. 25 is a graph of internal quantum efficiency from randomly distributed, subwavelength-structured solar cells formed using ion-implanted diffusion as a function of wavelength; planar surface response is shown for comparison.

Another alternative to isotropic Si etching is plasma-less etching such as a XeF$_2$-based, low-vacuum etching (See, e.g., D. E. Ibbotson et al., J. Appl. Phys. 56, 2939 (1984)).

b. Conformal Junction Formation on Deeply Etched Vertical Surfaces:

RIE surface damage can be removed using the wet-chemical DRE treatments discussed hereinabove. However, due to advantages of dry semiconductor processing, it is preferable to remove surface damage without resorting to wet-chemical etching chemistry. Ion implantation has been investigated for junction formation. Ion implantation has been used for junction formation for solar cells (See for example, E. C. Douglas and R. V. D'aillo, IEEE Trans. Elect. Dev. 27, 792 (1980)). During the implantation process, the surface is partially amorphized as taught in *Ion Implantation and Beam Processing*, edited by J. S. Williams and J. M. Poate, Academic Press (1984). According to their teachings, the degree of amorphization is a function of dose level and implant energy. In order to repair the damage, annealing at high temperature to re-crystallize the ion-implanted amorphous layers is performed. This process proceeds epitaxially on the underlying crystalline substrate; for Si this solid phase re-crystallization starts at a temperature of ~525° C. During a constant temperature re-crystallization process, the amorphous-crystalline interface moves towards the surface as a function of time until the entire amorphous layer is crystallized. The possibility that during the implant damage repair process, the RIE surface damage may also be repaired has been investigated by the present inventor; random, RIE-textured, nanoscale surfaces shown in FIG. 11 were used. It is to be noticed that the random features on this surface provide significantly more open area for damage than, for example, a periodic surface. FIG. 24 shows internal quantum efficiency (IQE) measurements from a solar cell fabricated on such a surface using conventional gas-source diffusion for junction formation. The ratio of IQE measurements from RIE-textured and planar regions shows that due to surface damage, the textured region IQE is suppressed over the entire spectral region. FIG. 25 shows the IQE measurements from solar cells fabricated on random RIE-textured surfaces using ion implantation. The ratio of IQE measurements from RIE-textured and planar regions shows that due to the amorphization repair process, both the implant and RIE damage have been removed, resulting in the textured region IQE being significantly higher than the planar region over most of the spectral region. FIG. 25 also demonstrates a maximum enhancement of ~5.4 at λ~1.1 μm, which is greater by a factor of 2 relative to the rectangular grating case shown in FIG. 11. Therefore, using an implantation technique for junction formation, superior grating solar cells can be fabricated without any surface damage. Recent developments in plasma-assisted doping techniques show that implants typical of solar cells can be provided by minor modifications of plasma chambers typically used for reactive ion etching (See, for example, M. J. Goeckner et al., J. Vac. Sci. Technol. B 17, 2290 (1999)).

c. Grating Solar Cells Fabrication Using Gas Source Diffusion:

The process of grating formation using reactive ion etching techniques introduces contamination and subsurface plasma-induced damage that is not completely removed even by a complete RCA clean process. Therefore, fabrication of Si solar cells and other photosensitive devices has to be modified from the teachings in *Fundamentals of Solar Cells, supra*. A typical grating solar cell fabrication procedure in accordance with the present invention is as follows using p-type Si having 8–16 Ω-cm resistivity and a thickness of about 300 μm as an example of the starting material:

a) KOH, or dry etch thinning of active regions to ~50 μm using a PECVD nitride mask;

b) Fabrication of appropriate front, back, and sidewall grating and random microscopic structures using reactive ion and/or anodic etching;

c) Complete RCA cleaning to remove surface contamination;

d) RIE-induced surface damage removal using wet-chemical and dry etching including KOH, nitric acid, and XeF$_2$ as described in section 4.a, hereof;

e) Formation of n-type (Phosphorous doping) junction using gas source doping, or solid source diffusion in accordance with the teachings of *Fundamentals of Solar Cells, supra*; and f) Formation of n and p contacts using metal stacks as taught in Fundamentals of Solar Cells, supra.

d. Grating Solar Cells Fabrication Plasma Doping:

Ion implantation for junction formation has been shown to be desirable for removing RIE-induced surface damage, as described in section 4.b, hereof. Therefore, the grating solar cells and other photosensitive devices can be formed using the following as a typical sequence using p-type Si having 8–16 Ω-cm resistivity and thickness of about 300 μm, as an example of the starting material:

a) KOH-thinning of active regions to ~50 μm using a PECVD nitride mask;
b) Fabrication of appropriate front, back, and sidewall grating and random microscopic structures using appropriate reactive ion and/or anodic etching;
c) Complete RCA clean to remove surface contamination;
d) n-type junction formation using plasma implantation; typical parameters are: ion species $^{31}P^+$; energy ~5 KeV; and Dose ~$2.5 \times 10^{15}$ cm$^{-2}$;
e) Furnace implant anneal and passivation oxide growth at ~1000° C. for 30 min in $O_2$ atmosphere; and
f) Formation of n and p contacts using metal stacks as taught in *Fundamentals of Solar Cells*, supra.

Note that ion implantation can also be achieved using ion implantation techniques described in section 4.b hereof.

5. Discussion of Grating Solar Cell Results

Figure 26:
FIG. 26a is a schematic representation of a thin-film silicon solar cell having periodic and/or random subwavelength microscopic structures on the front, sidewalls, and back surface with the active area having been reduced.
FIG. 26b is an SEM output for KOH-thinning of a silicon wafer from approximately 500-μm thickness to about 300-μm.
Figure 26:
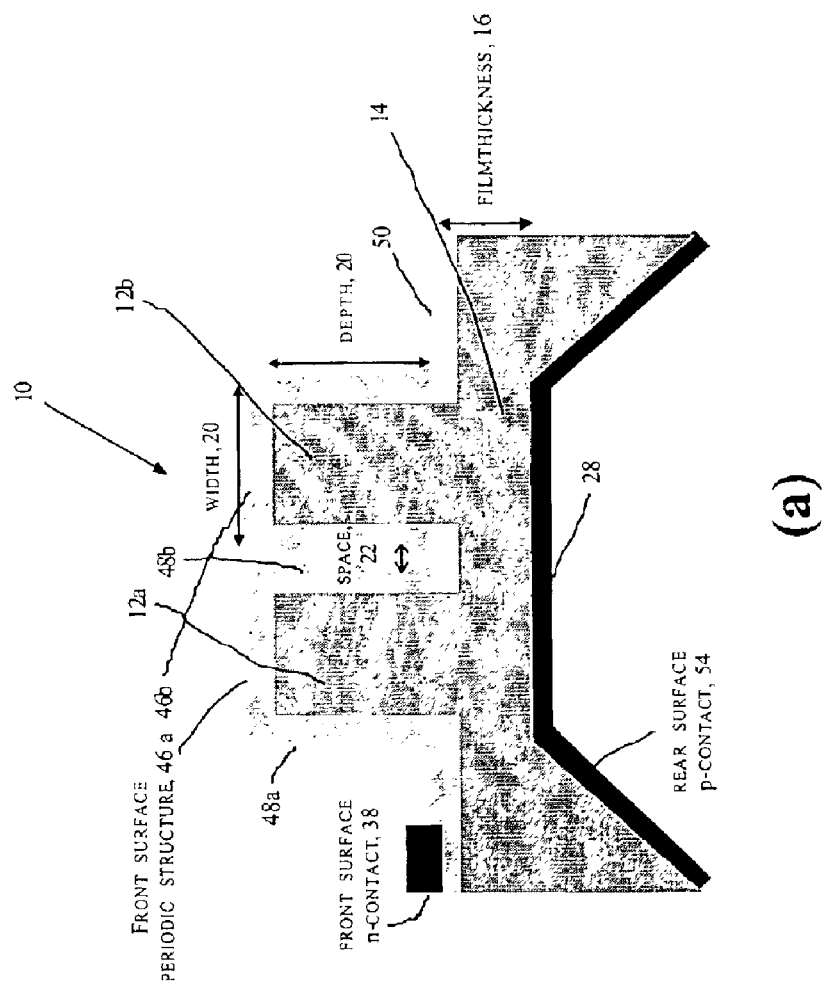

A detailed design, modeling, fabrication, reflectance and IQE characterization of subwavelength Si microscopic structures integrated into solar cells has been described. By combining RIE etching with PECVD oxide deposition, wafer cleaning, wet-chemical damage removal etches, and ion implanted junctions, undamaged Si surfaces can be recovered. FIG. 26a shows a diagram of a solar cell where the active region is thinned, 54, while surface protection against breakage is achieved by un-etched regions. SEM output for this embodiment is shown in FIG. 26b hereof. With appropriate PECVD, or LPCVD nitride masks, a thick wafer can be thinned to about 50-μm while leaving thicker regions to support the thin film. Alternatively, one can also use $XeF_2$ etching for wafer thinning. In accordance with the present invention, the use of thin Si films for solar cells in the space environment has significant advantages. For example, reduced weight, which lowers the launch costs, and enhanced radiation tolerance. In earlier work on thin-film crystalline Si solar cells, significant radiation-tolerance could not be achieved due to incomplete optical confinement and the inability to collect deeply generated electron-hole pairs. Several subwavelength optical structures etched almost entirely throughout the thin film that serve the dual purpose of helping to increase optical absorption and reducing carrier recombination losses are described herein. Subwavelength optical microscopic structures increase absorption of light by the thin film by enhanced scattering and waveguide mechanisms. The presence of high-quality three-dimensional junctions throughout the thin film separated by distances between 1 and 10 μm range help collect a majority of electron-hole pairs before losing them to recombination.

The foregoing description of the invention has been presented for purposes of illustration and description and is not intended to be exhaustive or to limit the invention to the precise form disclosed, and obviously many modifications and variations are possible in light of the above teaching.

The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for forming thin film solar cells and photodetectors having increased light absorption and radiation tolerance, which comprises the steps of:

(a) forming a plurality of macroscopic features having a chosen periodic spacing, width and depth on a first surface of a p- or n-doped film suitable for solar cell or photodetector applications and formed therefrom, each feature having at least one surface perpendicular to the first surface of the film and one surface parallel thereto, there also being formed surfaces between each of the plurality of macroscopic features
   (b) attaching an electrical contact to at least a portion of a second surface of the film, the second surface being generally parallel to and spaced apart a chosen thickness from the first surface;
   (c) n- or p-doping the region of the surfaces of the plurality of macroscopic features and the region of the surfaces between each of the plurality of macroscopic features, forming thereby a p-n or n-p junction, respectively, with the doped film;
   (d) attaching an electrical contact to at least a portion of the junction, whereby the film is adapted to produce a photovoltaic response to light having a chosen wavelength or wavelengths incident thereon, the period of the macroscopic features, the width and the depth thereof and the thickness between the first and second surfaces of the film being chosen such that minority carrier diffusion length for carriers produced by the photovoltaic response of the film is larger than the largest distance between a location interior to the film and the junction; and
   (e) randomly etching 3-dimensional microscopic structures having dimensions less than the wavelength or wavelengths of light onto the surfaces of the macroscopic features which are parallel to the surface of the film and onto the surfaces between each of the plurality of macroscopic features such that light incident thereon is scattered into a multiplicity of high diffraction orders which propagate obliquely to the direction of incidence of the light, thereby trapping the incident light by total internal reflection and increasing light absorption by the film.

2. The method as described in claim 1, wherein the thin film has a thickness between 10 μm and 50 μm.

3. The method as described in claim 1, further comprising the step of etching random, 3-dimensional microscopic structures having dimensions smaller than the wavelength or wavelengths of light onto the second surface of the film.

4. The method as described in claim 1, further comprising the step of etching random, 3-dimensional microscopic structures having dimensions smaller than the wavelength or wavelengths of light onto the surfaces of the plurality of macroscopic features perpendicular to the first surface of the film.

5. The method as described in claims 1, 3, or 4, wherein said step of randomly etching 3-dimensional microscopic structures is performed using a method selected from the group consisting of reactive ion etching, anodic etching, and wet-chemical etching.

6. The method as described in claim 5, further comprising the step of removing surface damage resulting from said step of random reactive ion etching of 3-dimensional macroscopic features and microscopic structures by selective etching the surface using materials selected from the group consisting of NaOH, KOH, nitric acid, and $XeF_2$.

7. The method as described in claim 6, further comprising the step of generating a grating structure having a third chosen period onto the second surface of the film wherein the third chosen period is smaller than the chosen period of the macroscopic features, whereby incident light thereon is distributed into higher diffraction orders which are trapped within the silicon film.

8. The method as described in claim 6, further comprising the step of generating a microscopic grating structure having a fourth chosen period onto the surfaces of the plurality of macroscopic features perpendicular to the surface of the film wherein the fourth chosen period is smaller than the chosen period of the macroscopic features, whereby incident light thereon is distributed into higher diffraction orders which are trapped within the macroscopic features.

9. The method as described in claim 1, further comprising the step of generating a pyramidal pattern having a period approximately equal to the period of the plurality of macroscopic features onto the surfaces of the plurality of macroscopic features perpendicular to the first surface of the film.

10. The method as described in claim 1, further comprising the step of generating a microscopic grating structure having a second chosen period onto the surfaces of the plurality of macroscopic features perpendicular to the first surface of the film wherein the second chosen period is smaller than the chosen period of the macroscopic features, whereby incident light thereon is distributed into higher diffraction orders which are trapped within the macroscopic features.

11. The method as described in claim 10, further comprising the step of generating a microscopic grating structure having a third chosen period onto the second surface of the film wherein the third chosen period is smaller than the chosen period of the macroscopic features, whereby incident light thereon is distributed into higher diffraction orders which are trapped within the film.

12. The method as described in claims 9, 10, or 11, wherein said step of forming a plurality of macroscopic features having a chosen periodic spacing, width and depth, said step of generating a microscopic grating structure, and said step of generating a pyramidal pattern are performed using a method selected from the group consisting of reactive ion etching, wet-chemical etching, and anodic etching.

13. The method as described in claim 12, further comprising the step of removing surface damage resulting from said step of random, reactive ion etching of 3-dimensional macroscopic and microscopic structures by selective etching the surface using materials selected from the group consisting of NaOH, KOH, nitric acid, and $XeF_2$.

14. The method as described in claim 1, wherein the plurality of macroscopic features is a 2-dimensional structure.

15. The method as described in claim 1, wherein the doped film suitable for solar cell and photodetector applications is selected from the group consisting of silicon and gallium arsenide.

16. The method as described in claim 1, wherein said step of doping the surfaces of the plurality of macroscopic features and the surfaces between each of the plurality of macroscopic features is achieved using a method selected from the group consisting of gas source diffusion, solid source diffusion, ion implantation, and plasma doping.

17. The method as described in claim 1, wherein the thin film has a thickness between 10 μm and 50 μm.

18. A method for forming solar cells and photodetectors having increased light absorption and radiation tolerance, which comprises the steps of:

(a) forming a plurality of macroscopic features having a chosen periodic spacing, a chosen width and a chosen depth on a first surface of a p- or n-doped film suitable for solar cell and photodetector applications and formed therefrom, each feature having at least one surface perpendicular to the first surface of the film and one surface parallel thereto, there also being formed surfaces between each of the plurality of macroscopic features;

(b) attaching an electrical contact to at least a portion of a second surface of the film, the second surface being generally parallel to and spaced apart a chosen thickness from the first surface;

(c) n- or p-doping the region of the surfaces of the plurality of macroscopic features and the region of the surfaces between each of the plurality of macroscopic features, thereby forming a p-n or n-p junction, respectively, with the doped film;

(d) attaching an electrical contact to at least a portion of the doped surfaces, whereby the film is adapted to produce a photovoltaic response to light having a chosen wavelength or wavelengths incident thereon, the period of the macroscopic features, the width and the depth thereof, and the thickness between the first and second surfaces of the wafer being chosen such that minority carrier diffusion length for carriers produced by the photovoltaic response of the film is larger than the largest distance between a location interior to the film and the junction; and (e) generating a microscopic grating structure having a second chosen period on the surface of each feature parallel to the first surface of the film wherein the second chosen period is smaller than the chosen period of the macroscopic features, whereby incident light thereon is distributed into higher diffraction orders which are trapped within the macroscopic features.

19. The method as described in claim 18, wherein the thin film has a thickness between 10 μm and 50 μm.

20. The method as described in claim 18, further comprising the step of etching random, 3-dimensional microscopic structures having dimensions smaller than the wavelength or wavelengths of light onto the second surface of the film.

21. The method as described in claim 20, wherein said step of randomly etching 3-dimensional microscopic structures is performed using a method selected from the group consisting of reactive ion etching, anodic etching, and wet-chemical etching.

22. The method as described in claim 21, further comprising the step of removing surface damage resulting from said step of random reactive ion etching of 3-dimensional macroscopic features and microscopic structures by selective etching the surface using materials selected from the group consisting of NaOH, KOH, nitric acid, and $XeF_2$.

23. The method as described in claim 18, wherein the doped film suitable for solar cell and photodetector applications is selected from the group consisting of silicon and gallium arsenide.

24. The method as described in claim 18, wherein said step of doping the surfaces of the plurality of macroscopic features and the surfaces between each of the plurality of macroscopic features is achieved using a method selected from the group consisting of gas source diffusion, solid source diffusion, ion implantation, and plasma doping.

25. The method as described in claims 18, 7 or 8, wherein said step of forming a plurality of macroscopic features having a chosen periodic spacing, width and depth, and said step of generating a grating structure, are performed using a method selected from the group consisting of reactive ion etching, anodic etching, and wet-chemical etching.

26. The method as described in claim 25, further comprising the step of removing surface damage resulting from said step of random reactive ion etching of 3-dimensional macroscopic features and microscopic structures by selective etching the surface using materials selected from the group consisting of NaOH, KOH, nitric acid and $XeF_2$.

27. A method for forming solar cells and photodetectors having increased light absorption and radiation tolerance, which comprises the steps of:
   (a) forming a microscopic grating structure having a chosen period and chosen depth on a first surface of a p- or n-doped film suitable for solar cell and photodetector applications;
   (b) attaching an electrical contact on at least a portion of a second surface of the film, the second surface being generally parallel to and spaced apart a chosen thickness from the first surface, wherein the chosen depth of the microscopic grating structure is less than the chosen thickness of the film;
   (c) n- or p-doping the surfaces of the generated grating structure, forming thereby a p-n or n-p junction, respectively, with the film; and
   (d) attaching an electrical contact to at least a portion of the doped surfaces of the generated microscopic grating structure, whereby the film is adapted to produce a photovoltaic response to light having a chosen wavelength or wavelengths incident thereon, the chosen period of the microscopic grating structure and the thickness between the first and second surfaces of the film being chosen such that minority carrier diffusion length for carriers produced by the photovoltaic response of the film is larger than the largest distance between a location interior to the film and the junction.

28. The method as described in claim 27, further comprising the step of etching random, 3-dimensional microscopic structures having dimensions smaller than the wavelength or wavelengths of light onto the second surface of the film.

29. The method as described in claim 28, wherein said step of randomly etching 3-dimensional microscopic structures is performed using a method selected from the group consisting of reactive ion etching, anodic etching, and wet-chemical etching.

30. The method as described in claim 29, further comprising the step of removing surface damage resulting from said step of random reactive ion etching of 3-dimensional microscopic structures by selective etching the surface using materials selected from the group consisting of NaOH, KOH, nitric acid and $XeF_2$.

31. The method as described in claim 27, wherein the doped film suitable for solar cell and photodetector applications is selected from the group consisting of silicon and gallium arsenide.

32. The method as described in claim 27, wherein, the chosen depth of the microscopic grating structure on the first surface is comparable to the chosen thickness of the film.

33. The method as described in claim 27, wherein the microscopic grating structure on the first surface comprises a 2-dimensional structure.

34. The method as described in claim 27, wherein said step of doping the surfaces of the plurality of macroscopic features and the surfaces between each of the plurality of macroscopic features is achieved using a method selected from the group consisting of gas source diffusion, solid source diffusion, ion implantation, and plasma doping.

35. The method as described in claim 27, wherein said step of forming a microscopic grating structure, is performed using a method selected from the group consisting of reactive ion etching, wet-chemical etching, and anodic etching.

36. The method as described in claim 35, further comprising the step of removing surface damage, resulting from said step of fabricating microscopic grating structures by reactive ion etching, by using materials selected from the group consisting of NaOH, KOH, $XeF_2$, and nitric acid.

\* \* \* \* \*